(12) United States Patent
Schmid et al.

(10) Patent No.: US 8,279,615 B2
(45) Date of Patent: Oct. 2, 2012

(54) ENCAPSULATION MODULE METHOD FOR PRODUCTION AND USE THEREOF

(75) Inventors: Bernhard Schmid, Friedberg (DE); Roland Hilser, Kirchheimteck (DE); Heikki Kuisma, Helsinki (FI); Altti Torkkeli, Tuusula (FI)

(73) Assignee: Continental Teves AG & Co. oHG (DE)

( * ) Notice: Subject to any disclaimer, the term of this patent is extended or adjusted under 35 U.S.C. 154(b) by 451 days.

(21) Appl. No.: 12/519,288

(22) PCT Filed: Dec. 14, 2007

(86) PCT No.: PCT/EP2007/063975
§ 371 (c)(1),
(2), (4) Date: Apr. 2, 2010

(87) PCT Pub. No.: WO2008/077821
PCT Pub. Date: Jul. 3, 2008

(65) Prior Publication Data
US 2010/0290199 A1    Nov. 18, 2010

(30) Foreign Application Priority Data

Dec. 21, 2006 (DE) .......................... 10 2006 060 794
Dec. 14, 2007 (DE) .......................... 10 2007 060 931

(51) Int. Cl.
*H05K 5/00* (2006.01)
(52) U.S. Cl. ........ 361/752; 438/107; 438/404; 438/406; 438/455; 438/479; 257/E21.22; 257/E21.122; 257/E21.545
(58) Field of Classification Search .................. 361/752; 438/107, 404, 406, 455, 479; 257/E21.22, 257/E21.122, E21.545
See application file for complete search history.

(56) References Cited

U.S. PATENT DOCUMENTS

| | | | | |
|---|---|---|---|---|
| 6,303,462 B1 * | 10/2001 | Gidon | ........................... | 438/406 |
| 7,259,080 B2 * | 8/2007 | Quenzer et al. | ............... | 438/455 |
| 7,416,961 B2 | 8/2008 | Quenzer et al. | | |
| 2004/0180517 A1 * | 9/2004 | Quenzer et al. | ............... | 438/479 |
| 2007/0091971 A1 | 4/2007 | Tanaka | | |

FOREIGN PATENT DOCUMENTS

| | | |
|---|---|---|
| DE | 103 31 322 A1 | 2/2005 |
| EP | 1 353 373 A2 | 10/2003 |
| WO | WO 02/073684 A1 | 9/2002 |
| WO | WO 03/072286 A1 | 9/2003 |
| WO | WO 2005/061376 A1 | 7/2005 |

* cited by examiner

*Primary Examiner* — Xiaoliang Chen
(74) *Attorney, Agent, or Firm* — RatnerPrestia

(57) ABSTRACT

A method for producing an encapsulation module and/or for encapsulating a micromechanical arrangement, wherein electronic connection provisions are formed from a blank of electrically conductive semiconductor material, by one or more structuring processes and/or etching processes, wherein, in the course of forming the electronic connection provisions, a pedestal of the semiconductor material arises, on which the electronic connection provisions are arranged, wherein the latter are subsequently embedded with an embedding material and the embedding material and/or the semiconductor pedestal are removed after the embedding to an extent such that a defined number of the electronic connection provisions have electrical contacts on at least one of the outer surfaces of the encapsulation module thus produced, wherein upon forming the electronic connection provisions, on the pedestal of the semiconductor material, an insular material hump is formed, on which a plated-through hole is arranged in each case, and which embodies a semiconductor electrode.

29 Claims, 31 Drawing Sheets

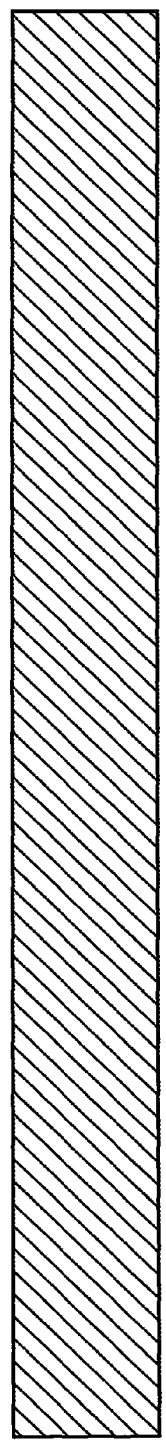

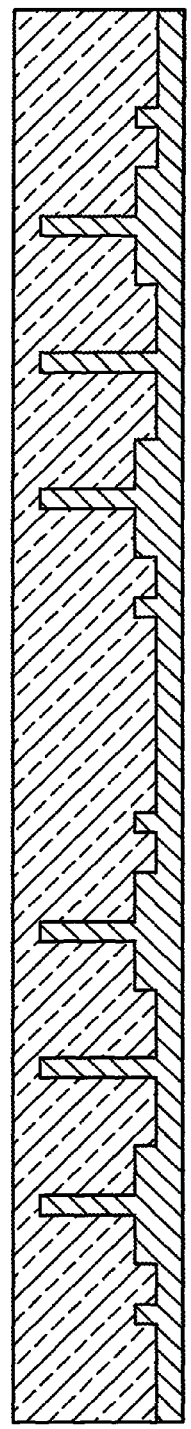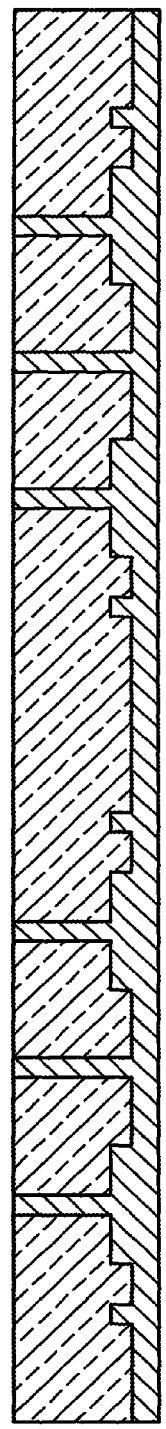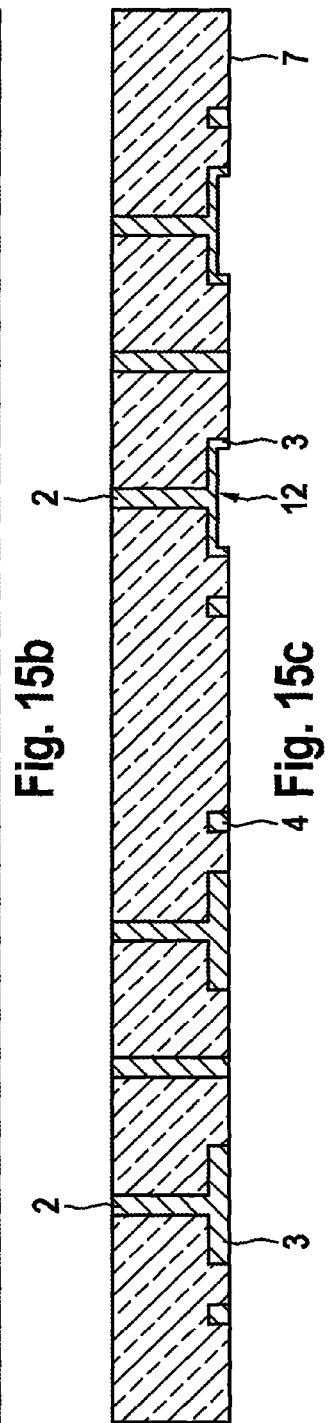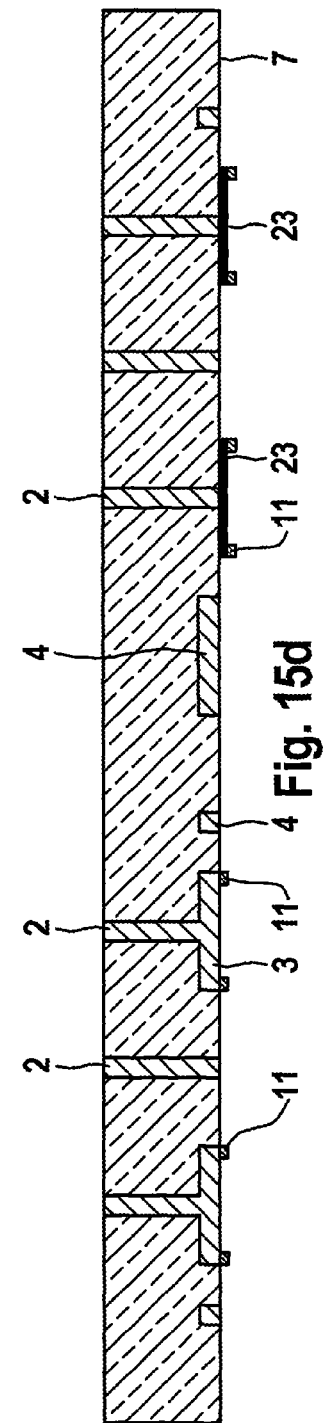

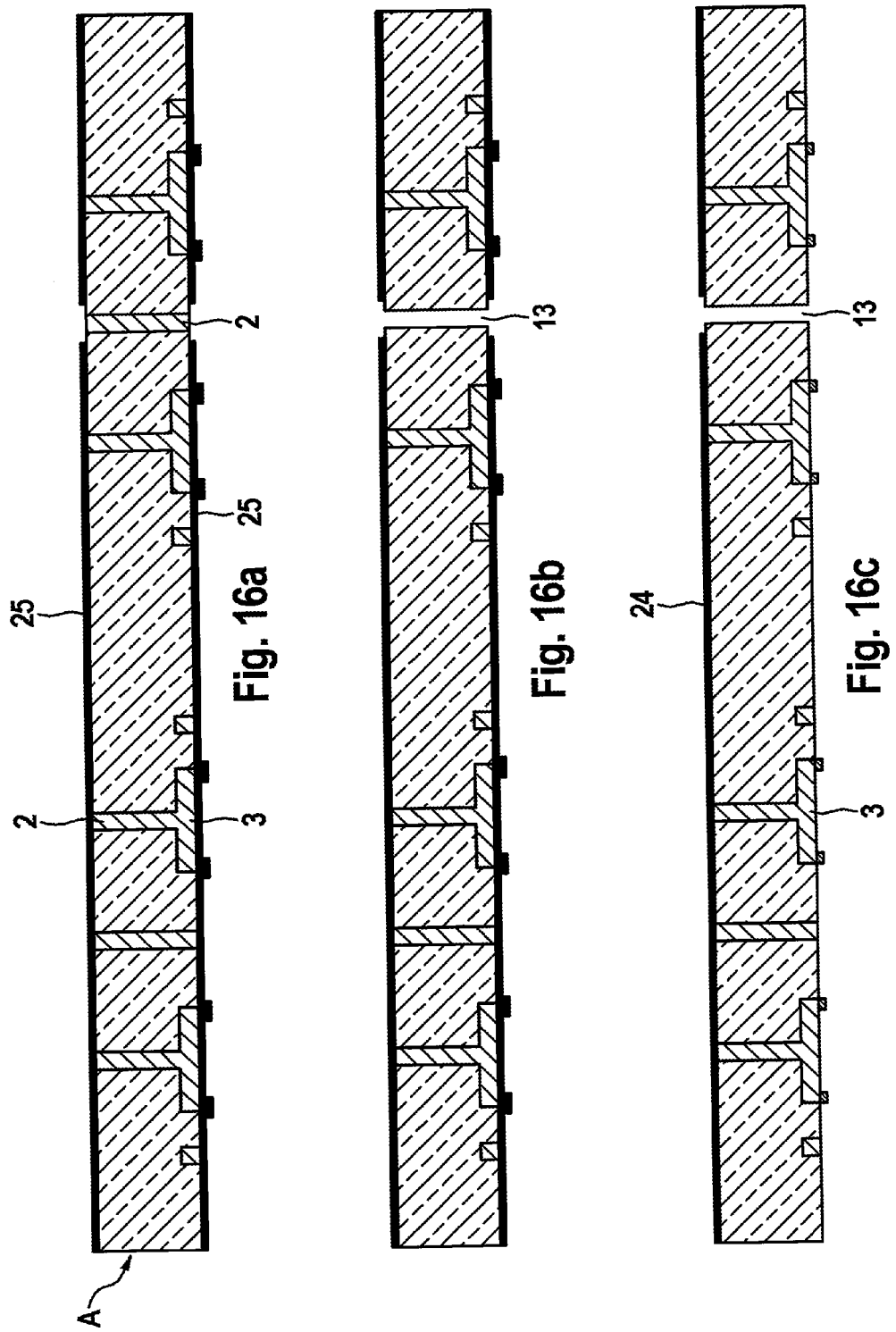

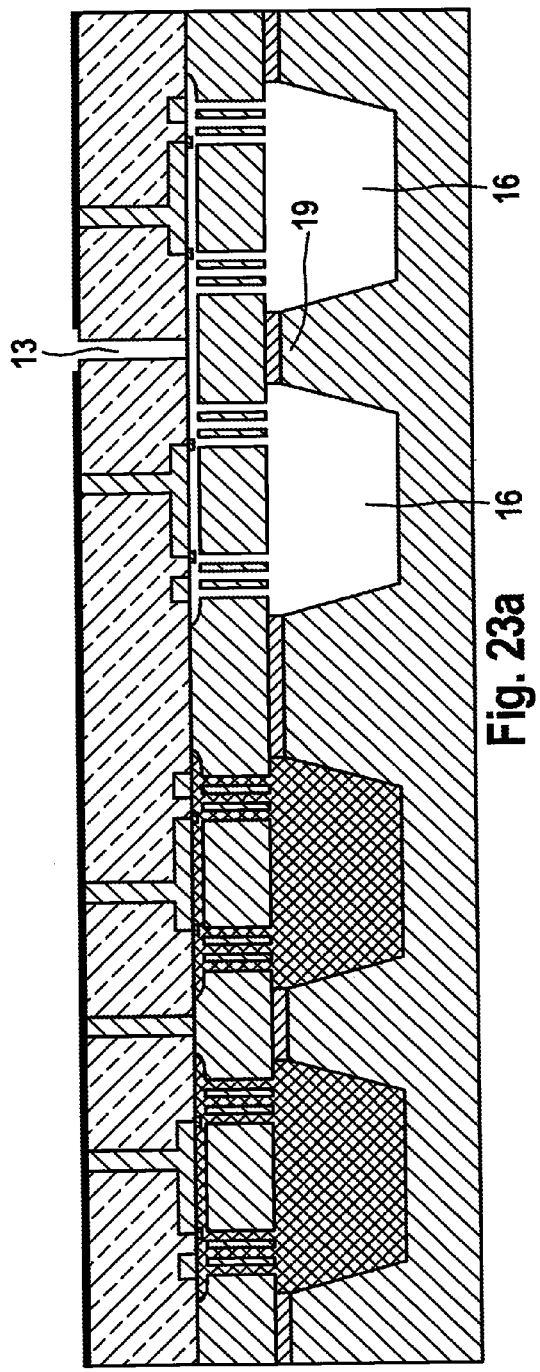
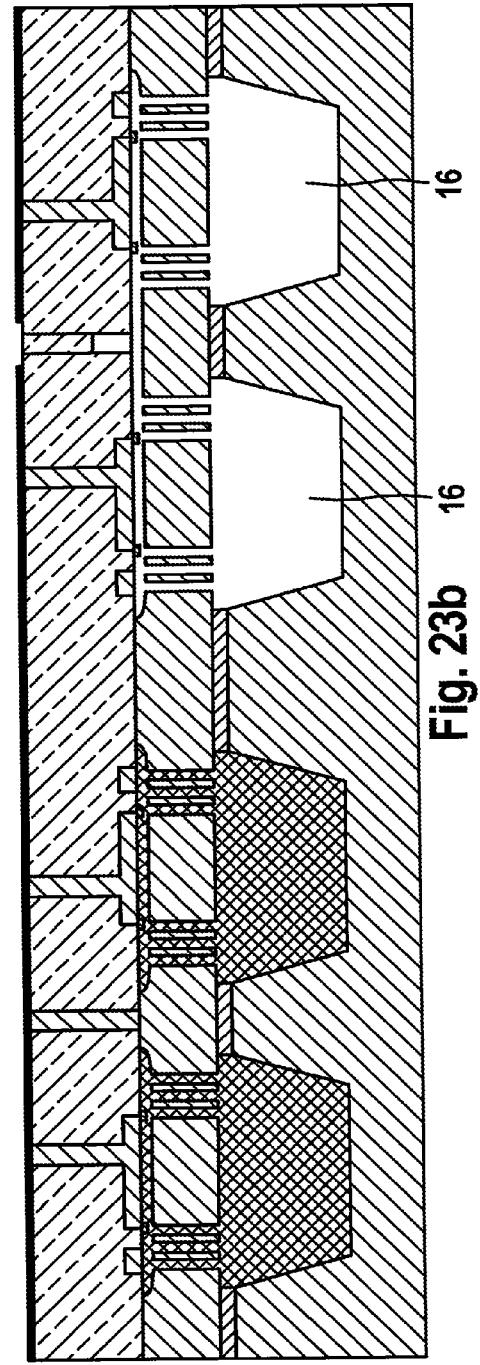
Fig. 23a
Fig. 23b

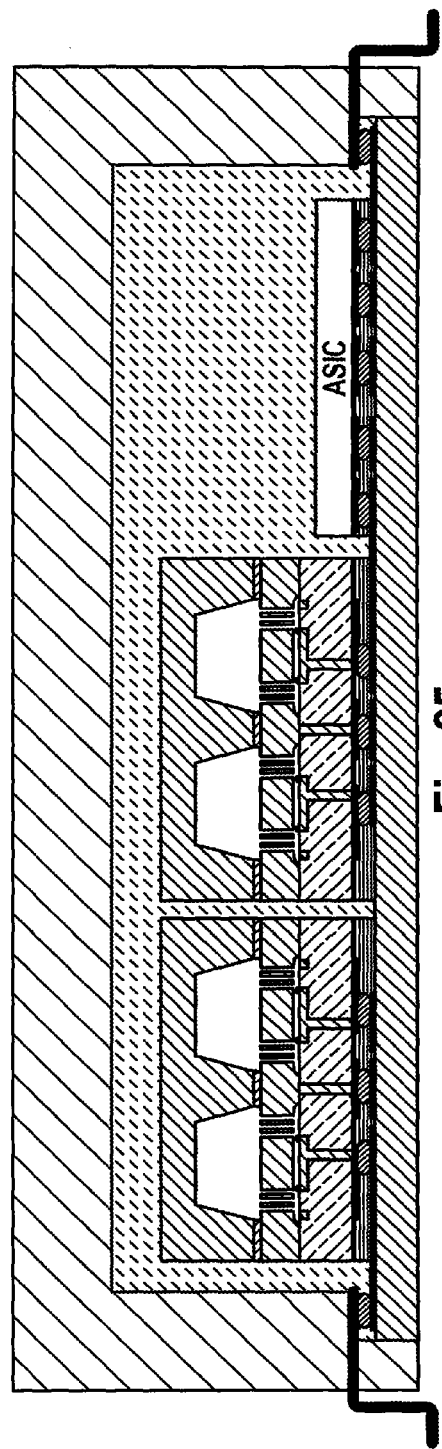
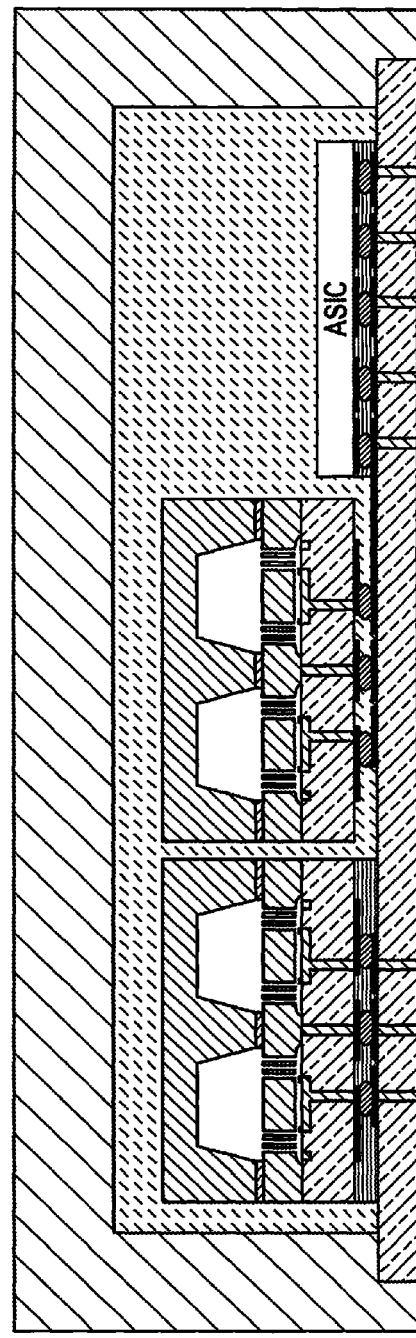
Fig. 35
Fig. 36

ENCAPSULATION MODULE METHOD FOR PRODUCTION AND USE THEREOF

CROSS REFERENCE TO RELATED APPLICATIONS

This application is the U.S. national phase application of PCT International Application No. PCT/EP2007/063975, filed Dec. 14, 2007, which claims priority to German Patent Application No. DE102006060794.5, filed Dec. 21, 2006 and German Patent Application No. DE102007060931.2, the contents of such applications being incorporated by reference herein.

BACKGROUND OF THE INVENTION

1. Field of the Invention

The invention relates to an encapsulation module and/or a micromechanical arrangement, a production method, and the use of such an encapsulation module and/or of such a micromechanical arrangement in motor vehicles.

2. Description of the Related Art

Document EP 1 371 092 B1 proposes a planar substrate composed of glass which has perforations or feedthroughs composed of electrically conductive silicon.

When such a planar substrate is used in a micromechanical arrangement, metal electrodes are usually applied to at least one base surface of said planar substrate, said metal electrodes being connected to feedthroughs and interacting as capacitor plates with micromechanical structures. For electrically and mechanically reliable transition connections between silicon and a metal electrode, use is often made of electrodes composed of at least two metals.

On account of the contact-connection of different materials, in particular different metals and/or crystalline or amorphous silicon, adverse effects on the parameters of the components such as, for example, a high temperature gradient or a deficient long-term stability can occur. Moreover, parasitic effects can creep in, such as, for example, electromotive forces (battery effect), electromigration and corrosion, in particular the latter leads to problems with regard to the long-term stability of the components.

SUMMARY OF THE INVENTION

The invention relates to a method for producing an encapsulation module and/or a micromechanical arrangement and a corresponding encapsulation module and/or a micromechanical arrangement in which metal electrodes can be dispensed with and, in particular, the above difficulties are thereby avoided at least in part.

The invention relates to the concept, in particular, of proposing a production method and also a correspondingly produced encapsulation module and/or a micromechanical arrangement which has at least one plated-through hole and at least one semiconductor electrode composed of electrically conductive semiconductor material in each case and these are embedded in an electrically substantially nonconductive embedding material.

An electrode and/or semiconductor electrode is understood preferably to be a means of a capacitive component or of a capacitive arrangement or a plate of a plate capacitor which, in particular, is part of a micromechanical read-out device and/or drive device. An electrode and/or semiconductor electrode alternatively preferably serves as electrical connection means or contact means.

A read-out device is understood expediently to be a device which has at least two electrodes or other electrical/electronic elements whose common capacitance/capacitance changes in the assemblage and/or whose potential difference with respect to one another is measured. In particular, such a read-out device has intermeshing conductor surfaces/plates which are electrically substantially insulated from one another and of which one is fixed to a base element, particularly preferably to a frame and/or one or more seismic masses and/or to a coupling beam and the other to a micromechanical module or wafer. A read-out device has a pair of electrodes, in particular.

A drive device is understood preferably to be a capacitive drive having at least two opposite conductor surfaces, in particular capacitor plates, of which one is connected to at least one base element and/or a seismic mass and the other is connected to a micromechanical module or wafer. By applying a differential voltage to these conductor surfaces, the latter can be moved relative to one another. In particular a drive mode of a sensor element, such as, for example, of a rate-of-rotation sensor element, is produced by means of at least one drive unit.

A module, in particular an encapsulation module, carrier module or a structure module, is understood preferably to be a micromechanical means which is itself a micromechanical system and/or a micromechanical structure or which can be supplemented in combination with other modules to form a micromechanical system. Such modules are preferably wafer modules which are produced and formed in accordance with the respective requirements.

A structuring process is understood preferably to be an etching process, which particularly preferably comprises wet-chemical etching, in particular by means of KOH (potassium hydroxide), or anisotropic etching by means of TMAH (tetramethylammonium hydroxide), and/or an anisotropic dry etching, in particular ion milling or an electron beam method and/or an anisotropic reactive ion etching, such as, in particular, DRIE (deep reactive ion etching), such as, for example, an etching passivation method, in particular with polymer passivation intermediate steps, and/or a gyrostatic etching method.

Further structuring processes alternatively preferably comprise a mechanical machining method such as, in particular, milling and/or sawing.

In the context of the method, it is expedient to carry out one or a plurality of etching processes and in particular no mechanical process for forming the electronic connection means, since mechanical processes normally permit only relatively long structuring widths and, in particular, produce a grid-shaped formation, such as by means of sawing tracks, for example.

The connection or the joining together of at least two micromechanical modules or the silicon wafers is preferably effected by means of at least one wafer bonding method. In this case, it is particularly preferred to use at least one anodic glass-silicon, anodic glass-aluminum, solder, fusion, eutectic metal, adhesive bonding or other suitable wafer joining methods. It is especially preferred to carry out fusion bonding of the two micromechanical modules, such as, for example, a structure module, in particular comprising at least one sensor element, and an encapsulation module, under an $O_2$ atmosphere, such that during the high-temperature process the $O_2$ reacts with the silicon and a silicon oxide layer forms on the surface within at least one cavity of the structure module that is enclosed by the bonding process. This serves as an etching stop layer during the subsequent structure etching, in particular.

Preferably, a gap is produced between two micromechanical modules, in particular a structure module and an encapsulation module, by means of a local oxidation or a LOCOS process (local oxidation of silicon).

It is preferred to introduce a joining layer composed of insulating or conductive material between the two micromechanical modules, which layer connects the two modules or wafers to one another either in an insulating manner or in an electrically conductive manner. In this case, locally insulating or electrically conductive joining surfaces can be produced by means of a plurality of selective structuring and deposition methods for the joining layer.

The proposed technology does not have problems known from the prior art as described further above, or has them only to a smaller extent. In particular, this is achieved by virtue of the fact that the technology can be flexibly adapted to the requirements of the application (modular construction system). It is preferably suitable for inertial sensors, such as acceleration, rate-of-rotation, pressure sensors, with capacitive conversion of mechanical movements into electrical signals, and vice versa. On account of the flexibility of the proposed technology, there is particularly preferably the possibility of integrating different applications on one piece of silicon. If a direct chip integration, for example on an ASIC, is not possible, then the proposed technology makes it possible, in particular, for other components also to be incorporated into a common housing and to be externally connected in a precise manner and without wiring outlay.

The electrically conductive semiconductor material is preferably doped, crystalline or amorphous silicon.

The at least one plated-through hole is preferably formed as an electrical line and/or as a heat conducting path.

In the context of the method, it is expedient that during the embedding of the electronic connection means with the embedding material and/or during the subsequent hardening of the embedding material, the embedding material is formed into a substantially disk-shaped body in which the electronic connection means are embedded. In this case, the embedding process comprises in particular at least one casting and/or melting process. In particular, the shaping of the disk-shaped body takes place by means of a mold that receives or adjoins the pedestal of the semiconductor material, such that the electronic connection means are arranged within the mold and are embedded by the potting material when the potting material is filled into the mold. The potting material is alternatively preferably cast into a "mold" comprising the pedestal of the raw material as base and a narrow edge of the raw material as walls. This narrow, circumferential edge of the raw material is formed for this purpose beforehand during the at least one etching and/or structuring process in which the electronic connection means are also formed.

A substantially disk-shaped body is understood preferably to be a body having two base surfaces, that is to say a bottom surface and a top surface, which are substantially parallel to one another. In this case, the body thickness, that is to say the distance between the base surfaces, can be in particular greater than the length and/or the width or the diameter of a base surface of the disk-shaped body. Particularly preferably, however, the disk-shaped body is formed in flat fashion, that is to say that the body thickness is less than the length or the width or the diameter of a base surface of the disk-shaped body.

It is expedient that, in the context of the method, at least one of the outer surfaces of the encapsulation module is coated with at least one conductive material. In particular, said material is a metal which is applied by vapor deposition or by means of a sputtering method. Below the conductive layer, an electrically insulating layer is particularly preferably formed, which electrically insulates the conductive layer from the corresponding base surface of the encapsulation module apart from at least one electronic connection means. Especially preferably, the conductive layer, in particular also without the presence of an insulating layer described above, is subsequently structured and in this case forms contact-connections or contact pads via which at least one side of at least one plated-through hole can be electrically connected, in particular by means of a bonding wire or other contact-connection methods known in semiconductor technology, such as, for example, by means of soldering balls (ball grid array) and/or a flip-chip assembling.

It is preferred to extend the method in such a way that electronic and/or mechanical means such as electrical contact elements, buffer elements, stopper elements or cavities are applied on at least one outer surface of the encapsulation module, for the accurately fitting connection of the encapsulation module to at least one micromechanical structure and/or at least one further micromechanical module. In particular, a crimp contact is produced between encapsulation module and a structure module, said contact arising from a metallic layer of one of the modules by means of pressure and heat. Such a crimp contact serves for contact-connection between plated-through hole and structure. Said crimp contact is particularly preferably produced in the case of an anchor or a pillar of the structure module.

Preferably, at least in part, electrically insulating material is applied on that base surface of the encapsulation module which is provided for encapsulation. Said material is formed and arranged in such a way that it can be used as mechanical means such as, for example, an overload stop and/or a stopper for a micromechanical structure to be encapsulated or a micromechanical sensor element. At least one such mechanical means is particularly preferably fixed or arranged on or below the semiconductor electrode.

The one or the plurality of mechanical means is/are preferably formed from electrically insulating material, in particular silicon oxide or nitride or diamond like carbon (DLC) or combinations of these materials.

It is expedient that, in the context of the method, glass is used as the potting material, and that the glass is potted in liquescent fashion over the electronic connection means or is potted directly as liquid glass and is subsequently hardened.

The method is preferably supplemented by virtue of the fact that at least one tunnel is produced between at least two, in particular opposite, outer surfaces of the encapsulation module by means of at least one structuring process and/or etching process. Particularly preferably, the at least one tunnel is produced by removing at least one plated-through hole to which, in particular, no semiconductor electrode is assigned.

It is expedient for the method to be supplemented to the effect that at least one additional micromechanical structure or at least one structure module is encapsulated, in particular hermetically, or in a gastight manner by the encapsulation module, wherein, in particular before the encapsulation, at least one electrical plated-through hole of the encapsulation module to which, in particular, no semiconductor electrode is assigned is removed, for example by means of an etching process. In this case, at least one tunnel through the encapsulation module into the interior of the corresponding micromechanical structure or the structure module arises, and afterward, through said tunnel(s), in particular in each case, a defined medium with a defined pressure is introduced into the respective interior of the corresponding micromechanical structure. It is likewise possible, in particular, for a media exchange to be effected by means of the tunnel. By means of this procedure, a defined atmosphere can be set in one or a plurality of structure spaces. This is advantageous in particular since different sensor elements or sensor element types have different requirements made of the atmosphere of the structure space, for example with regard to the medium and pressure. By means of the above method, it is particularly preferably possible for a plurality of different structures or sensor elements to be integrated on a common chip in a relatively simple manner. For this purpose, especially preferably, a plurality of structure spaces are encapsulated with at least one encapsulation module having a plurality of tunnels, in particular in each case at least one tunnel per structure space. In addition, in particular inlets or outlets for pressure sensors, liquid channels, pumps or valves are produced by one or a plurality of open tunnels.

It is expedient in this case that the at least one tunnel is subsequently closed off. Particularly preferably, the subsequent closing off of the at least one tunnel is carried out by introducing an embedding and/or potting material into said at least one tunnel and subsequently hardening this material introduced into the tunnel.

Preferably, at least one semiconductor electrode is at least partly removed by means of at least one structuring and/or etching process, whereby a cavity is produced on a base surface of the encapsulation module and, in particular, a remaining part of the semiconductor electrode is available as a capacitor plate or contact-connection. Said cavity serves for example as space for the deflection of a micromechanical structure.

The removal of at least one plated-through hole to which, in particular, no semiconductor electrode is assigned in order to form a tunnel or the at least partial removal of a semiconductor electrode in order to form a cavity is preferably effected by means of a KOH, TMAH and/or other etching process.

In the course of forming the electronic connection means, preferably firstly at least one or more electrodes and/or contact areas and/or interconnects are formed from the blank of electrically conductive semiconductor material by means of substantially perpendicular etching and/or alternative structuring, such as, for example, by means of milling, on the pedestal. In this case, at least one interconnect is formed in particular as a cross-connection between two or more electrodes. This is followed by forming the one or the plurality of plated-through holes, which are particularly preferably formed as pillars on electrodes and/or contact areas and/or interconnects. These electronic connection means are subsequently embedded with embedding material, preferably glass.

It is preferred for the encapsulation module and/or the micromechanical arrangement to be formed in such a way that the disk-shapedly formed body has at least one tunnel between the two outer base surfaces. In this case, said at least one tunnel is open or closed off with embedding material or some other material. An open tunnel particularly preferably provides a defined atmosphere into a structure interior of a structure module and/or inlets or outlets for pressure sensors, liquid channels, pumps or valves.

It is expedient for the encapsulation module and/or the micromechanical arrangement to have at least one semiconductor electrode composed of electrically conductive semiconductor material which has an interface with one of the base surfaces of the disk-shapedly formed body and is formed in a manner extended substantially into mound-shaped fashion into the disk-shapedly formed body and is connected, in particular integrally, to a plated-through hole within said body.

At least one semiconductor electrode that is connected to a plated-through hole is alternatively preferably used as a relatively large-area electrical contact element or electrical contact and is particularly preferably contact-connected by means of a bonding wire.

Preferably, glass or a polymeric material, in particular resin, is used as embedding material for the encapsulation module and/or the micromechanical arrangement. The use of glass enables, in particular, anodic bonding with silicon.

It is preferred for the disk-shapedly formed body of the encapsulation module and/or of the micromechanical arrangement to be coated with a conductive material at least one location, on at least one of the two outer base surfaces. Particularly preferably, the conductive material layer is structured in such a way that individual segments from among the segments of said layer are connected to plated-through holes and thus form contact-connections or contact pads, in particular composed of metal. Especially preferably, at least one plated-through hole is assigned at one end to a semiconductor electrode or is connected integrally thereto, wherein the latter is embedded into the encapsulation module in a flush fashion, and on the other side this plated-through hole is assigned a metal contact-connection, in particular one as described above, or it is electrically conductively connected thereto.

The encapsulation module and/or the micromechanical arrangement preferably has at least one interconnect composed of electrically conductive semiconductor material which, with a base surface, has a common semiconductor interconnect surface and is formed in particular in a manner corresponding to the at least one semiconductor electrode. Said at least one semiconductor interconnect is particularly preferably connected to at least one plated-through hole and/or a semiconductor electrode. It is alternatively preferably formed only as a semiconductor interconnect for contact-connection on a base surface and has no additional connection to a plated-through hole. The at least one semiconductor interconnect is especially preferably formed and arranged in a manner corresponding to a semiconductor electrode and has in this case, however, a larger extent in a plane parallel to the base surface than a semiconductor electrode. Expediently, one or a plurality of semiconductor electrodes are arranged on the at least one semiconductor interconnect or assigned thereto and conductively connected thereto.

In this case, the at least one semiconductor electrode and/or the at least one semiconductor interconnect are expediently formed in a flush fashion with the corresponding base surface and thus substantially form no elevation and/or depression on said base surface.

The at least one semiconductor interconnect preferably connects at least two semiconductor electrodes.

It is preferred for at least one semiconductor electrode to be designed as an electrically conductive surface, in particular a capacitor plate, of a micromechanical read-out device and/or excitation/drive device or as electrical connection means.

The encapsulation module expediently has a frame composed of conductive semiconductor material. Said frame serves, in particular, for receiving the embedding material. Particularly preferably, said frame serves as electromagnetic shielding. In particular, additionally or alternatively, in the case where a plurality of encapsulation modules are formed on or from a common wafer or carrier wafer, the frame is used as a sawing track for separating encapsulation modules from one another, which is advantageous since the embedding material, such as glass, for example, can be sawn relatively poorly. In addition, the frames of the encapsulation modules can serve for mechanical stiffening with regard to the common wafer, in particular in the case where the wafer is thinned back or removed for the most part to the respective pedestal height.

Preferably, the disk-shapedly formed body has, on at least one of the two outer base surfaces, at least one micromechanical means, such as a buffer element, a stopper element, a mechanical overload stop, in particular composed of electrically insulating material, or a cavity, for interaction with additional micromechanical structures. In this case, particularly preferably, at least one buffer and/or stopper element is formed from electrically conductive or insulating semiconductor material and formed on at least one semiconductor electrode.

It is expedient for the disk-shapedly formed body of the encapsulation module and/or of the micromechanical arrangement to be connected to at least one additional micromechanical structure or a structure module in such a way that it encapsulates, in particular hermetically, or in a gastight manner the additional micromechanical structure(s), and that electrical connections and/or contacts of the additional micromechanical structure(s) are electrically conductively connected to and/or electrically interact with one or more plated-through holes and/or semiconductor electrodes and/or semiconductor interconnects, and optional further electrical connection means, which are embedded in the disk-shapedly formed body.

Preferably, the at least one micromechanical means, on at least one of the two outer base surfaces of the disk-shapedly formed body, is arranged and formed in such a way that said means can interact with the micromechanical means of the at least one additional micromechanical structure, such as membranes or bending beams.

It is expedient that the at least one additional micromechanical structure is/are electrically connected to at least one external, in particular integrated, electronic circuit via the at least one electrical plated-through hole and/or a semiconductor electrode and/or a semiconductor interconnect which is/are embedded in the disk-shapedly formed body. Particularly preferably, the at least one additional micromechanical structure is/are mechanically connected to at least one integrated circuit, in particular integrated on a chip, via the disk-shapedly formed body.

Preferably, the disk-shapedly formed body is connected mechanically and/or—by means of at least one of plated-through holes and/or semiconductor electrodes and/or semiconductor interconnects embedded in said body—electrically conductively to at least one additional micromechanical structure or structure module and/or at least one additional micromechanical arrangement and/or at least one integrated circuit, in particular arranged on a chip, in particular by means of additional soldering beads. Particularly preferably, the at least one additional micromechanical structure and/or the at least one additional micromechanical arrangement and/or the at least one integrated circuit, in particular integrated on a chip, is connected to one base surface of the disk-shapedly formed body mechanically and/or electrically conductively by means of at least one plated-through hole and/or semiconductor electrode and/or semiconductor interconnect, and in that the other base surface of the disk-shapedly formed body is connected to a printed circuit board or an additional electronic circuit or an additional encapsulation module, especially preferably by means of soldering beads, for example by means of a grid of soldering beads.

It is expedient for the disk-shapedly formed body to be arranged and fixed as a cover on a sensor housing, wherein at least one electronic circuit arranged in the sensor housing and/or at least one electronic component and/or at least one micromechanical structure or structure module is electrically conductively connected to at least one external electronic circuit via the at least one electrical plated-through hole and/or semiconductor electrode and/or semiconductor interconnect embedded in the disk-shapedly formed body. Particularly preferably, the disk-shaped body is sealed with respect to the sensor housing by means of a lacquer or a plastic.

The micromechanical arrangement preferably comprises one or more rate-of-rotation sensor elements and/or one or more acceleration sensor elements. In particular, at least two sensor elements are arranged substantially orthogonally with respect to one another with regard to their detection directions. Particularly preferably, the micromechanical arrangement comprises two or three sensors elements of the same type, which are arranged substantially orthogonally with respect to one another with regard to their detection direction, and also at least one pair of sensor elements of the same type, which are likewise arranged orthogonally with respect to one another with regard to their detection directions. Especially preferably, the micromechanical arrangement comprises three rate-of-rotation sensor elements and three acceleration sensor elements, which in particular form an inertial measurement unit (IMU) having six degrees of freedom. The micromechanical arrangement in particular additionally or alternatively preferably comprises redundant sensor elements.

The micromechanical arrangement expediently, in particular additionally, comprises one or more electronic circuits and/or components, such as, for example, an ASIC, a transmitting unit and/or a receiving unit or an antenna structure.

An electronic or electrical connection means is understood preferably to mean a plated-through hole, an electrical line, a contact, a semiconductor electrode, a semiconductor interconnect and/or other electronic/electrical structures and/or components.

A description is given below of individual preferred fabrication steps of the fabrication technology, and the possible alternatives thereof, from which a modular construction system for the production of a micromechanical arrangement is composed. Preferably, a micromechanical arrangement or an encapsulated structure comprises one or more structure modules and one or more encapsulation modules. The encapsulation modules enclose the structure in the so-called structure space or structure interior.

Two variants, K and L, are alternatively preferably proposed in this case. In the case of variant L, a structure module or structure wafer, in particular exclusively the underside thereof, is coated with an etching stop layer, while this is not the case in variant K. The advantage of variant L is that during subsequent trench etching, the etching is stopped on the oxide and an underetching or undercut of the structure produced is thus prevented. The oxide layer can also be produced during the bonding of the wafers.

A further alternative production process for a structure module is preferably the joining together of a preprocessed structure module or structure wafer with a, preferably simple, unstructured and in particular oxidized carrier wafer. Here as well, the two variants K and L discussed above are alternatively preferably conceivable (structure wafer coated with or without oxide film). Additional structure concepts can thus be realized, such as, for example, centers of mass transferred from the structure plane and/or the setting of the membrane thickness by anisotropic etching (dry, wet-chemical) of the cavities. The spacing from the carrier wafer through which the structure is freed can be introduced into the structure wafer and/or the carrier wafer itself by similar methods, such as LOCOS or DRIE or other anisotropic etching methods. Advantages of this production method in comparison with the method described above is the setting of a freely definable structure height using commercially available cost-effective wafer thicknesses, the avoidance of wafer thinning-back processes and the production of structures within the cavity.

The encapsulation module expediently permits all possibilities of wafer connecting technologies and at the same time enables electrical signals to be passed out from the structure space and particularly preferably the inclusion of different media within the structure spaces on a wafer, or within an MEMS system.

In this case, the method for producing the encapsulation module alternatively preferably concerns a method which produces vertical electrical connections with integrated silicon semiconductor electrodes and/or a method wherein means are produced which can be used to set selective media conditions in the structure space. In particular, after the application of stoppers, both sides of the encapsulation module are coated, with the exception of the locations at which an opening from one cover side to the other is intended to be produced or left.

Preferably alternatively to some of the exemplary embodiments illustrated hereinafter for the hermetic encapsulation of structure module and encapsulation module, the bonding surface, in particular between structure module and encapsulation module, can also be produced identically to the semiconductor electrodes made from silicon. In this case, the bonding is effected by means of a fusion bonding process. In this case, however, particularly preferably, care should be taken to ensure that the bonding temperature does not exceed the critical temperature for the potting material. Therefore, it is especially preferred to use plasma-activated "fusion bonding". In both cases, care should expediently be taken to ensure that the plated-through holes, by means of semiconductor electrodes, form an electrically conductive contact to the structure. This can be achieved by means of a conductive joining layer between the joining surfaces of encapsulation module and structure module. The conductive, in particular relatively thin, joining layer is applied to at least one of the two interfaces of the encapsulation module and/or of the structure module. As a result of the relatively high temperatures during the fusion bonding process, the metal diffuses into both interfaces composed of silicon, whereby a boundary layer of doped silicon which is electrically conductive forms and whereby electrical contacts between at least in each case one plated-through hole and one electrical contact of the structure module particularly preferably arise.

When carrying out an anodic bonding method, by contrast, a relatively high mechanical pressure is preferably exerted by the electrostatic force during the process, which pressure, in combination with the temperature development accompanying the process, produces a conductive "crimp contact" made from a metal layer on the joining surface of at least one of the modules. Such a crimp contact likewise produces an electrical contact between encapsulation module, in particular a plated-through hole, and at least one electrically conductive means of the structure module.

With regard to the hermetic encapsulation of at least one structure module with encapsulation modules on both sides, it is expedient when considering the technology sequence that a second encapsulation module can also be used alongside a carrier module. In this case, firstly preferably an electrode gap process is effected on the untreated structure wafer or the structure module, then this is followed by the bonding with respect to an encapsulation module with semiconductor electrodes and subsequently the thinning back of the structure module or of the structure wafer, followed by a second gap process with subsequent structure etching and bonding of the second encapsulation module. The filling by means of at least one tunnel with the same medium within all the structure spaces or the selective filling of the individual structure spaces is particularly preferred.

In order to produce a micromechanical arrangement comprising at least one encapsulated structure having at least one structure module and at least one encapsulation module, and at least one control and signal evaluation circuit (ASIC), simple assembling in a preformed housing by means of wire bonding is preferably carried out. The arrangement of encapsulated structures and in particular of an ASIC alongside one another in a preformed housing with electrical connections which make the signals from the ASIC and the encapsulated structure accessible externally and make contact therewith by means of wire bonding is possible with the plated-through hole and semiconductor electrode technology of the encapsulation module. By way of example, a cavity plastic housing, a metal housing or an MID package can be used as such a housing. The linking of the cover (LID), for example of a metal cover for electromagnetic shielding, to the housing can be effected for example by adhesive bonding or laser welding. The free space within the housing is preferably filled with gel, in particular a silicone gel, for stabilizing the wires and for sealing the components against moisture. In particular, there is arranged below the encapsulated structure an interlayer, for example a lamina having a high mass which brings about a mechanical decoupling of the encapsulated structure, for example with regard to vibrations. Particularly, preferably, the interlayer is fixed in soft fashion with respect to or with the housing and in hard fashion with respect to or with the encapsulated structure.

In order to produce a micromechanical arrangement of encapsulated structures including control and signal evaluation circuit (ASIC), assembling by means of flip-chip directly onto the ASIC and subsequently into a preformed housing is alternatively preferably carried out. The assembling on the ASIC by means of flip-chip technology is possible by means of the encapsulation module with plated-through holes and, in particular, semiconductor interconnects connected thereto for contact-connection. Between ASIC and encapsulated structure there may be situated for example an embedding material (underfill) for mechanical fixing, for vibration damping and for protection of the electrical contacts, for example against particles, the potting material or moisture. An advantage of the flip-chip technology is a self-aligning effect with respect to the contacts on the ASIC and thus the geometrical orientation of the encapsulated structure on or with respect to the ASIC and the saving of adhesive bonding and wire bonding of the encapsulated structure. The resultant chip stack or the combination of ASIC with encapsulated structure placed by flip-chip can in turn be assembled directly into a preformed housing by means of flip-chip technology. Such a housing can be for example a preformed plastic, metal or ceramic housing or an MID package. The mechanical fixing and sealing of the housing with respect to the ASIC is preferably effected by adhesive bonding or laser welding. The free space within the housing is filled in particular with gel or silicone gel, for stabilizing the wires and for sealing the components against moisture.

In order to join together a plurality of encapsulated structures and at least one ASIC on a simple silicon wafer or on an encapsulation module or a corresponding encapsulation wafer with plated-through holes and packaging to form a complex module, the encapsulated structures are preferably assembled or arranged together with other components, such as, for example, at least one ASIC, on a silicon wafer, which functions as a carrier, in particular, by means of flip-chip technology, adhesive bonding, soldering or wire bonding. These components thus particularly preferably form a chip stack. The electrical connections between the components are produced on the silicon wafer by means of simple metallization and structuring to form semiconductor interconnects. The metallization is particularly preferably to be connected to electrical contacts by wire bonding or suitable for flip-chip processes. An underfill material is especially preferably used. By means of the same method as, or a method similar to, the one used to carry out the production of semiconductor electrodes on the encapsulation module, wireless receiving and transmitting structures, such as, for example, coils or antennas, are preferably also fabricated and produced on the overall system. Equally, for this purpose surface acoustic wave (SAW) filters and also passive components could additionally be assembled on the carrier.

Preferably, the ASIC or the encapsulation wafer or the plated-through hole wafer is used as a housing termination, in particular a housing base. An adapted thermal expansion behavior and thus a small influence of the package on the encapsulated structure under thermal loading is thereby achieved.

In order to encapsulate and/or connect two or more micromechanical modules, use is preferably made of interlayers composed of a material having a high density and, in particular, having coefficients of thermal expansion adapted to silicon and/or having virtually invariable thermal expansion behavior and/or composed of adhesive layers having different hardnesses and/or metals for eutectic bonding connections and/or polymers for adhesive bonding. It is thereby possible to achieve, in particular, a reliable and robust connection and also a mechanical decoupling.

It is expedient that the proposed method steps for producing an encapsulation module and/or a micromechanical arrangement likewise additionally relate to the micromechanical arrangement and/or the encapsulation module per se, and vice versa, that is to say that preferred features of the encapsulation module and/or of the micromechanical arrangement additionally likewise relate to alternative and/or developing or supplementary method steps.

The invention additionally relates to the use of the encapsulation module and/or of the micromechanical arrangement in a motor vehicle, in particular in a motor vehicle control system.

The encapsulation module according to aspects of the invention and/or the micromechanical arrangement according to aspects of the invention are preferably provided for use in motor vehicles, in particular for use in motor vehicle control systems, particularly preferably in a motor vehicle braking system. For the integration of different applications, such as pressure, acceleration or rate-of-rotation sensors, different packaging technologies are often required in order to meet their specific requirements. The encapsulation module according to aspects of the invention is especially preferably provided for the packaging and integration of such different sensor elements, in particular on a common chip.

Further preferred embodiments emerge from the following descriptions of exemplary embodiments with reference to figures.

The following figures offer a schematic illustration of exemplary embodiments. These exemplary embodiments can be understood both as arrangements and as illustrated method states of an arrangement, or a respective arrangement at a defined point in time of the corresponding production method.

BRIEF DESCRIPTION OF THE DRAWINGS

In this case, in schematic illustration:

FIGS. 14 to 16 show exemplary production stages of an encapsulation module and alternative encapsulation modules, in particular comprising a tunnel, FIGS. 23, 24 show the selective inclusion of different media within different structure spaces of a structure module encapsulated with an encapsulation module, FIGS. 30 to 36 show various exemplary micromechanical arrangements and systems which comprise micromechanical modules.

DETAILED DESCRIPTION OF THE PREFERRED EMBODIMENTS

Figure 1:
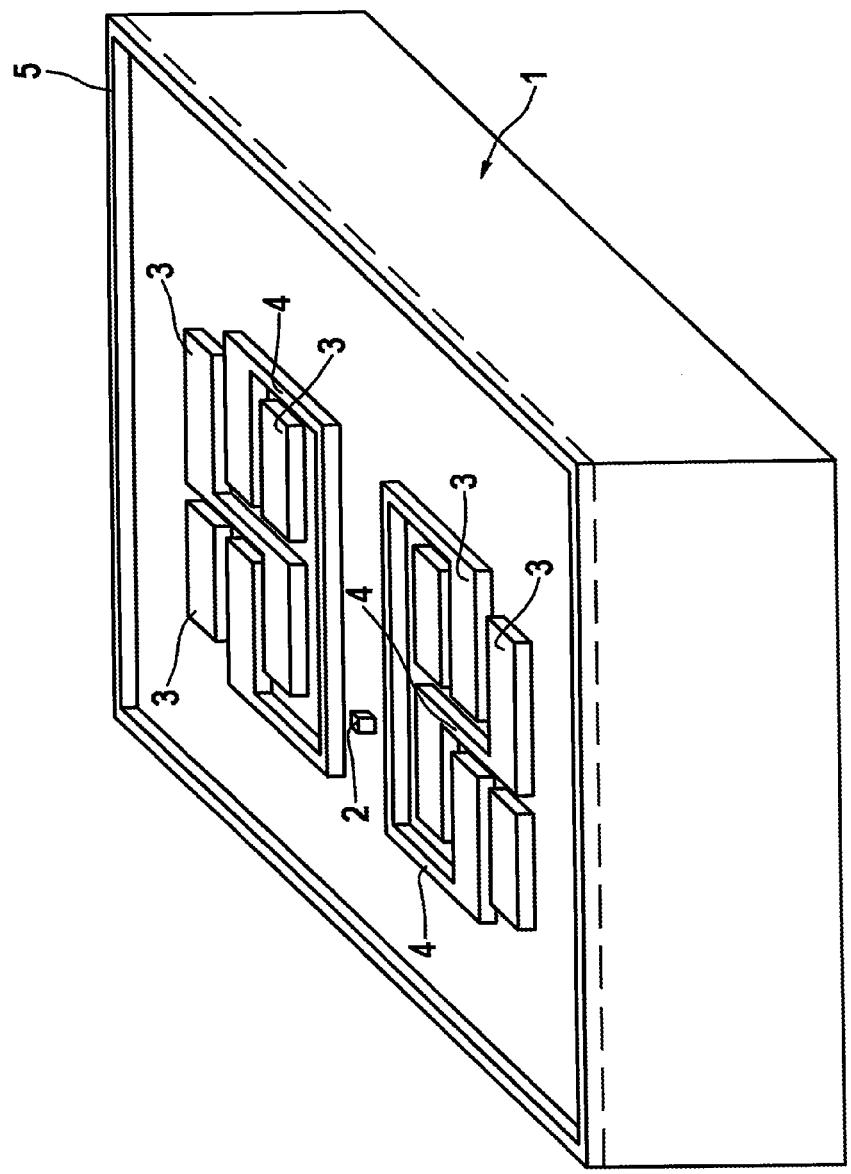
FIGS. 1 to 6 show an exemplary embodiment of an encapsulation module with plated-through holes and semiconductor electrodes, wherein individual production states are illustrated.

FIG. 1 shows an exemplary wafer or blank 1 composed of electrically conductive semiconductor material, in this case doped silicon, from which semiconductor material is removed by means of an etching method, whereby electronic connection means are formed. In this case, proceeding from the top surface of the wafer 1, etching is effected substantially perpendicularly downward. There are formed on the wafer by way of example semiconductor electrodes 3, semiconductor interconnects 4, which produce electrical connections between semiconductor electrodes, and also an initial formation of a plated-through hole 2 without an assigned semiconductor electrode or semiconductor interconnect as electronic connection means. Furthermore, the wafer 1 has a frame 5. Such a frame is not present in an alternative exemplary embodiment (not illustrated). Semiconductor electrodes 3 are formed substantially in insular fashion, by way of example.

Figure 2:
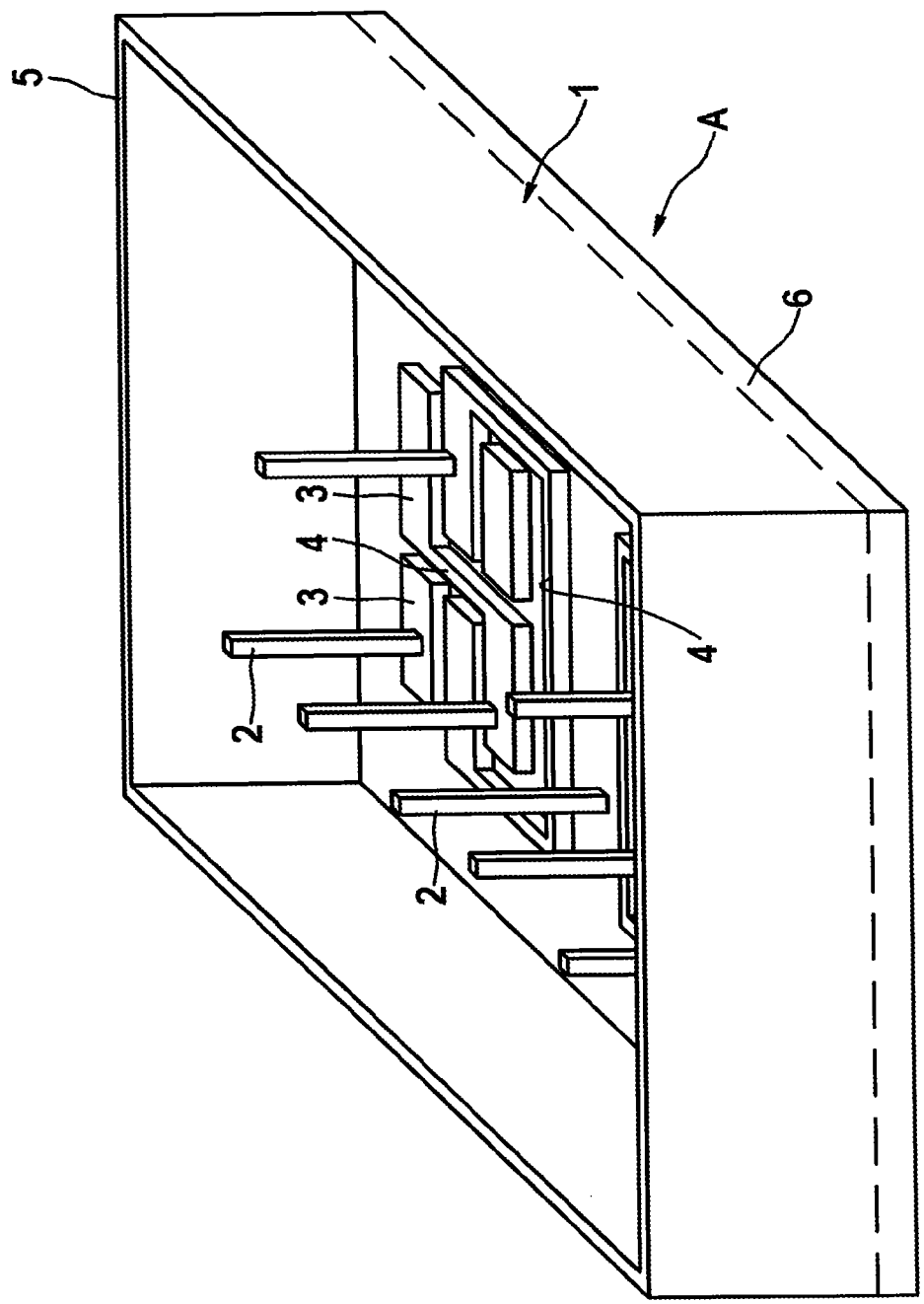

In FIG. 2, the doped silicon of the wafer or blank 1 is largely etched down further by way of example, with the result that a relatively flat pedestal 6 of the semiconductor material is formed, on which are arranged the electronic connection means in the form of semiconductor electrodes 3, semiconductor interconnects 4 and plated-through hole 2. In this case, the plated-through holes 2 are formed in pillar-shaped fashion and arranged for the most part on a respective semiconductor electrode 3. In this case, this respective plated-through hole is integrally connected to the respective semiconductor electrode 3. By way of example, encapsulation module A has a frame 5 composed of electrically conductive semiconductor material 5 in the illustrated stage of the production process. In an alternative exemplary embodiment (not illustrated), said frame 5 is not present or was removed down the pedestal 6 in the course of the etching processes.

Figure 3:
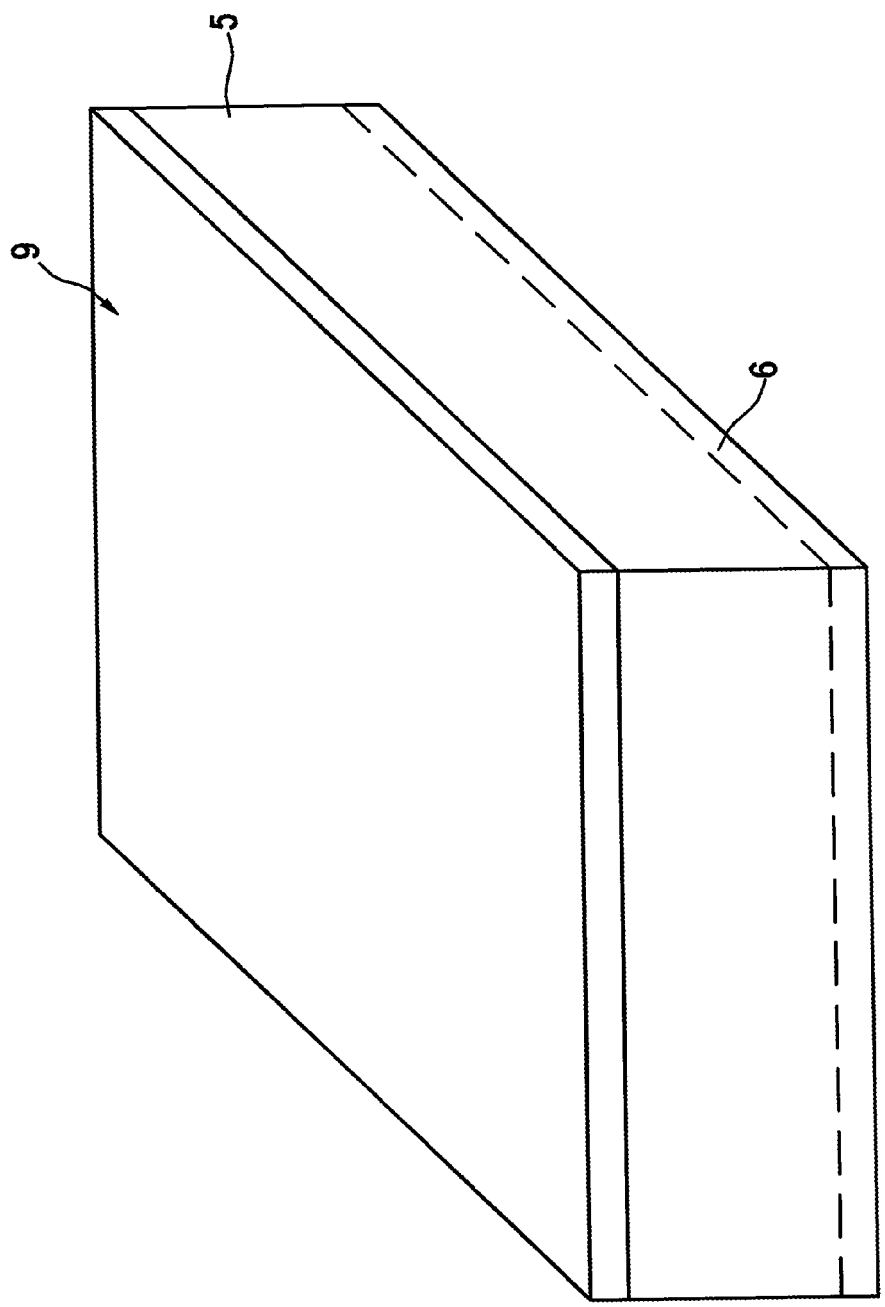

FIG. 3 illustrates by way of example the embedding of the electronic connection means produced from doped semiconductor material with an electrically insulating embedding material 9, by way of example a glass material. In this case, it is additionally possible to discern the pedestal of the semiconductor material 6, on which the electronic connection means are arranged, and also the frame 5, which serves for receiving the embedding material 9, since the latter embeds the electronic connection means in a liquid state and subsequently hardens. The frame 5 can also substantially encompass or enclose the entire encapsulation module wafer and thus serve as a flow limit. The frame 5 additionally optionally serves for the mechanical stabilization of the wafer after the plated-through holes have been formed.

Figure 4:
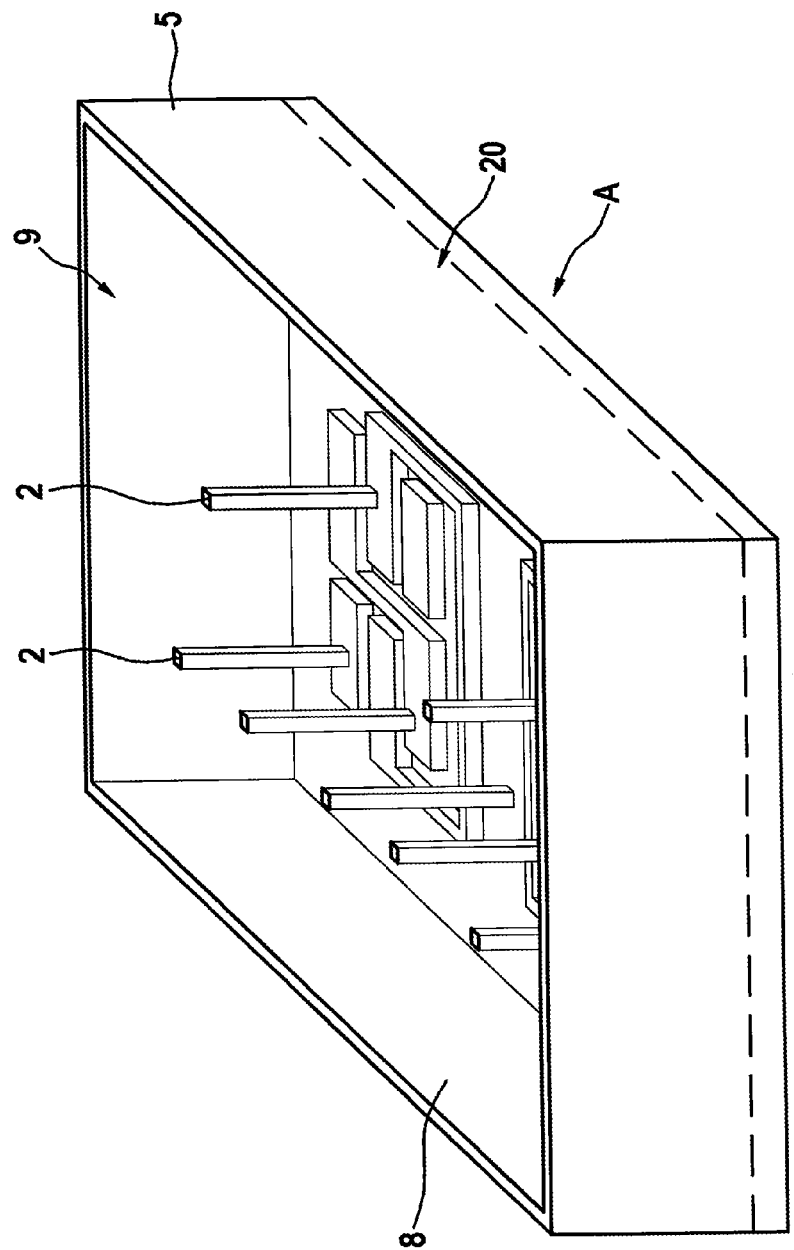

FIG. 4 illustrates a developed example of an as yet unfinished encapsulation module A, in which embedding material 9 was pulled back or thinned back to an extent such that plated-through holes 2 have a common, contact-connectable surface with top surface 8. Embedding material 9 and frame 5 form a substantially disk-shaped body 20.

Figure 5:
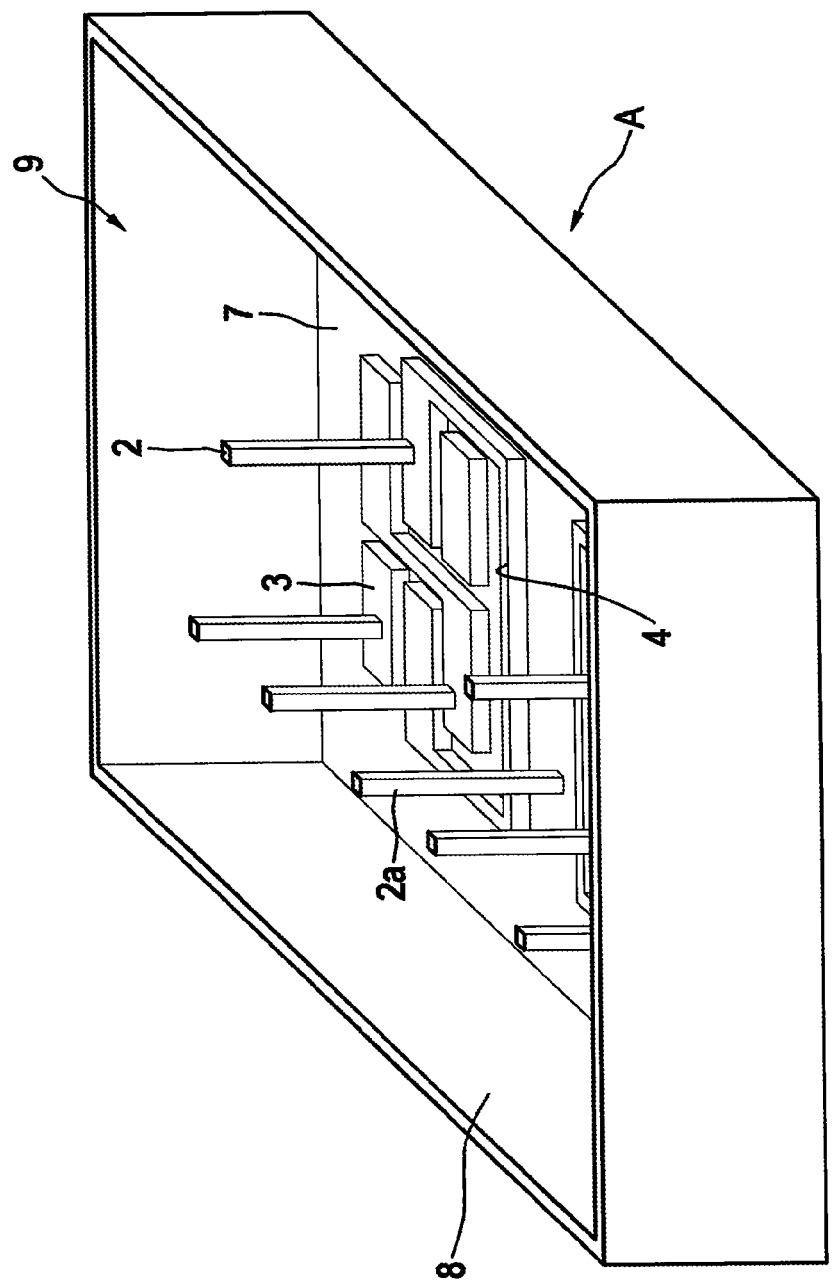

FIG. 5 shows an exemplary embodiment of an encapsulation module A whose pedestal of the semiconductor material, on which the electronic contact elements were arranged, was removed and the semiconductor electrodes 3 and also the interconnects 4 and plated-through hole 2*a* have a common, electrically contact-connectable surface with the bottom surface 7 or lower outer surface of the encapsulation module A. With regard to the top surface 8 or upper outer surface, plated-through holes 2 each have a common contact-connecting surface. The common surfaces of the electronic connection means with the bottom surface 7 and the top surface 8 are formed flush with said surfaces 7, 8.

Figure 6:
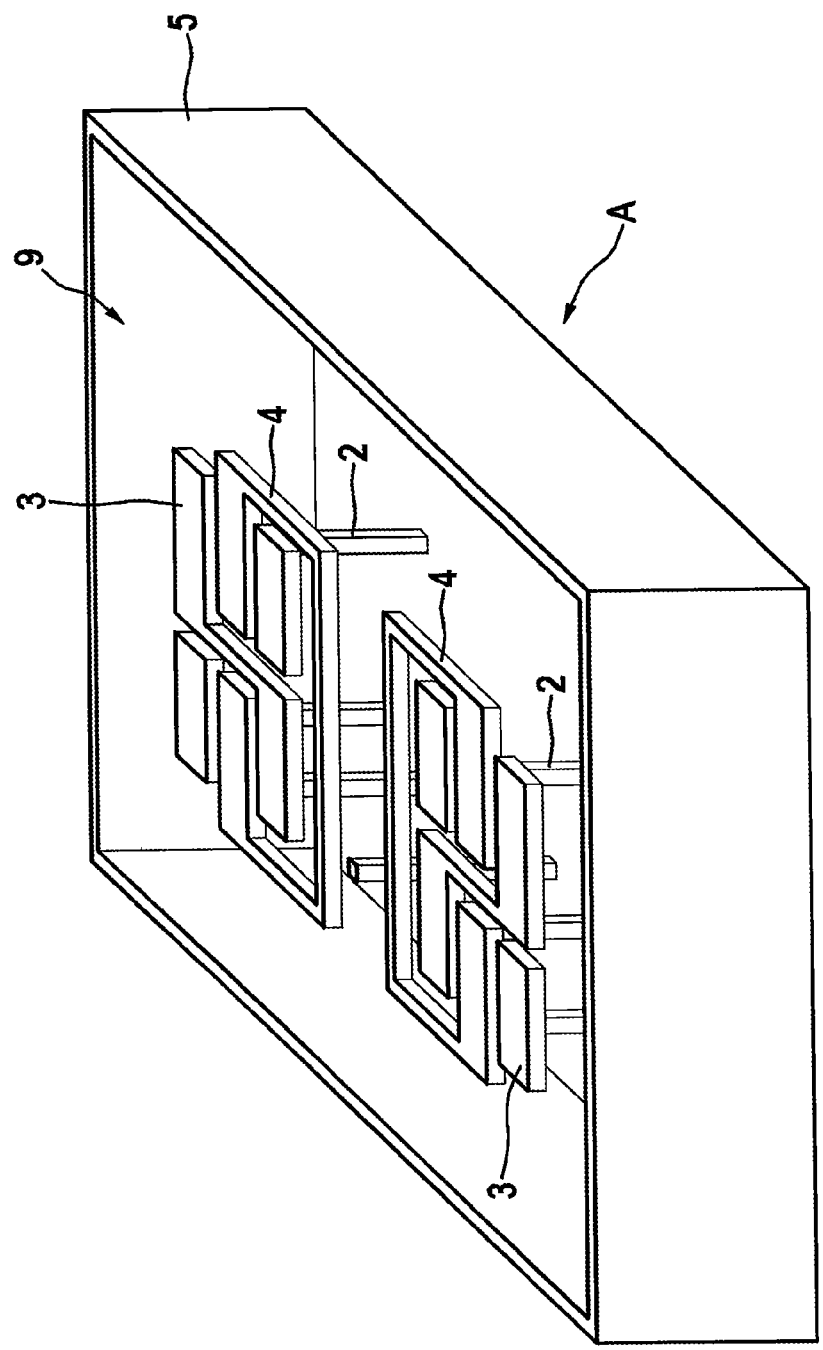

FIG. 6 illustrates an exemplary embodiment of an encapsulation module A in which the common surfaces—terminating flush—of the semiconductor electrodes 3 and semiconductor interconnects 4 with one base surface of the encapsulation module A are visible. These electronic connection means, which likewise include plated-through holes 2, are embedded in embedding material 9, which is glass by way of example. Frame 5 composed of doped silicon, which is absent in an exemplary embodiment that is not illustrated, serves by way of example for electromagnetic shielding. Frame 5 also optionally serves, with regard to the frames of a plurality of exemplary encapsulation modules on a wafer, as a sawing channel or sawing track, since silicon can be sawn more easily than glass. In addition, frame 5 also optionally serves for mechanical stabilization.

Figure 7:
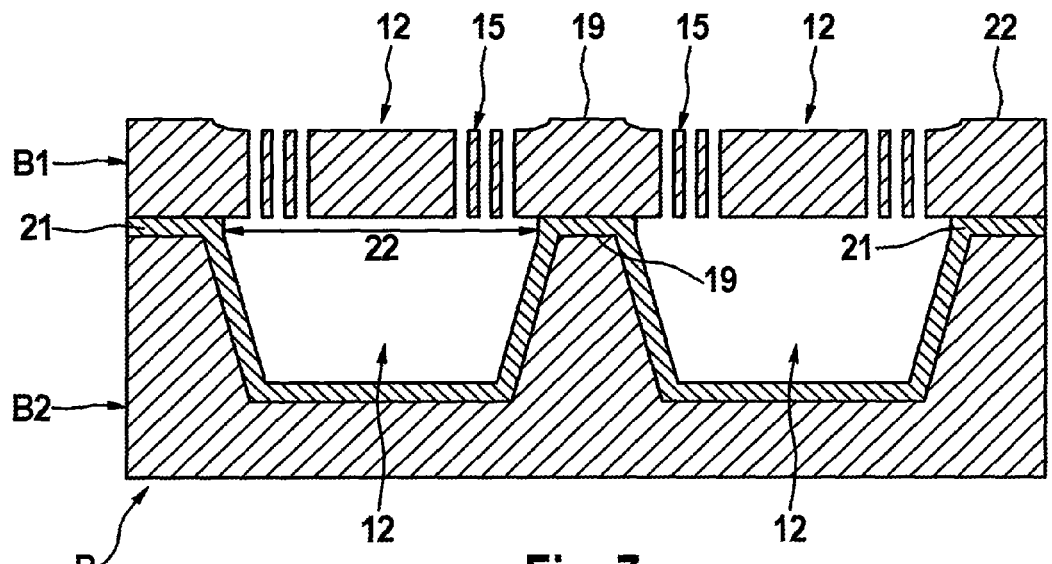
FIGS. 7 to 10 show exemplary embodiments of structure modules.

FIG. 7 shows an exemplary embodiment of a micromechanical structure module B or a structure wafer which has structures 15 produced by anisotropic silicon etching, by way of example. In this case, structure module B comprises a structure wafer B1 and a carrier wafer B2 connected thereto. Carrier wafer B2 has by way of example, two cavities 12, which enable mechanical deflections of the structures 15, and also anchor point 19 and frame 21, at which carrier wafer B2 with structure wafer B1 are fixedly connected by means of a joining method. On the one hand, the joining surface 22 can be completely surrounded by a cavity 12, which produces an anchor point 19 within the membrane; on the other hand, the cavity 12 can be completely surrounded by a joining surface 22, which produces a closed frame 21. One or a plurality of anchor points can also be situated within a closed frame. Structure wafer B1 has additional, dedicated cavities 12, anchor point 19 and frame 22 at its upper outer surface. Exemplary structure module B can thereby be encapsulated with an encapsulation module, wherein the encapsulation module then does not require any cavities for the deflection of the structures 15. In this case, anchor point 19 and frame 22 on the upper surface of the structure module form the joining surfaces for connection to an encapsulation module.

Figure 8:
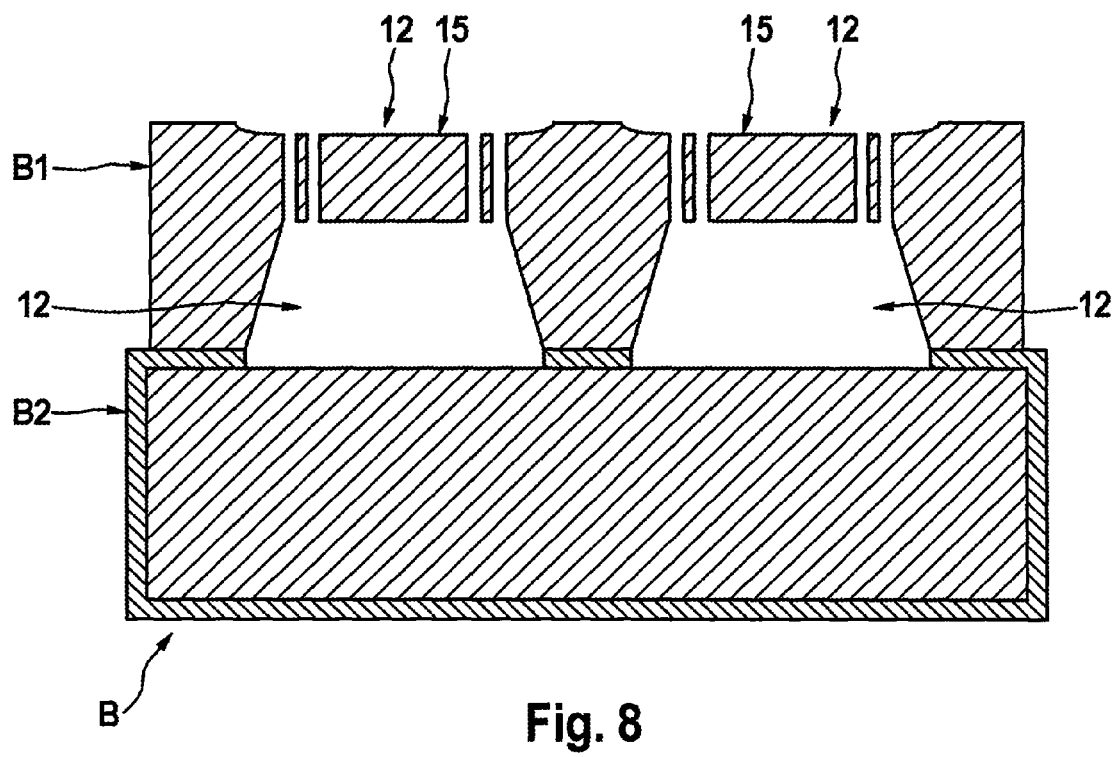

FIG. 8 illustrates an exemplary alternative to structure module B described above. This structure module B is produced by way of example by applying a prefabricated structure wafer B1 to a carrier wafer B2, which by way of example is unstructured and coated with an oxidized layer. In this case, above and below each structure 15, structure wafer B1 has cavities 12 for the deflection of the structures 15.

Figure 9:
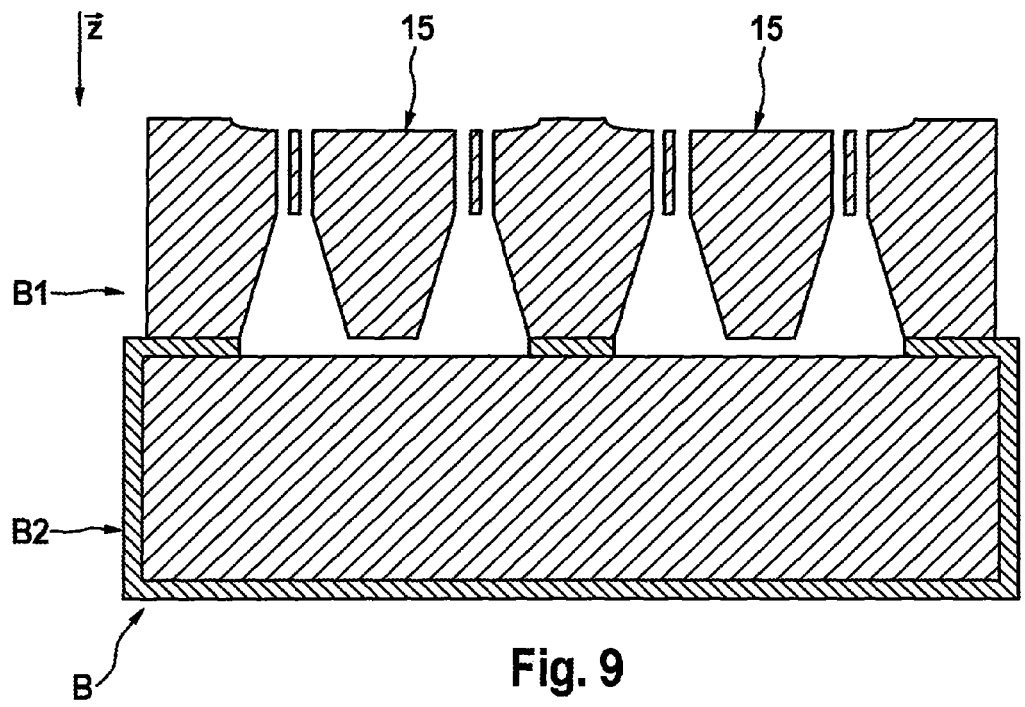

FIG. 9 shows an exemplary embodiment of a structure module B comprising a structure wafer B1 and a carrier wafer B2, wherein structure wafer B1 has structures 15 with transferred centers of mass. The centers of mass of the structures or of the seismic masses are in this case transferred in the z direction outside the plane spanned by the frame of the structure. The seismic masses of the structures 15 are correspondingly formed convexly in the z direction, by way of example.

Figure 10:
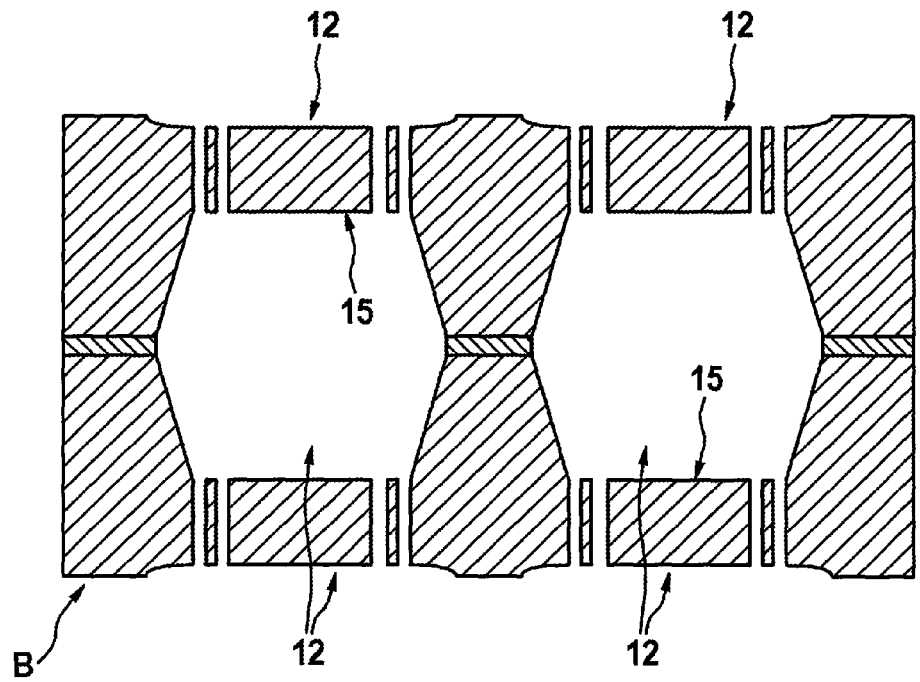
Figure 11A:
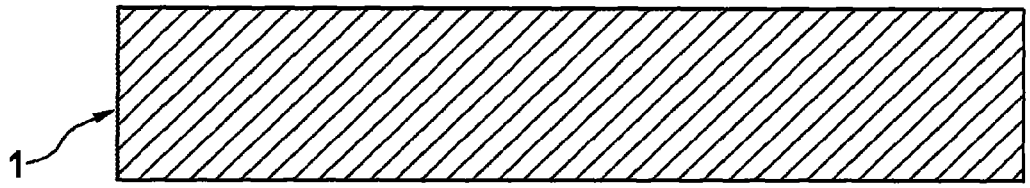
FIGS. 11 to 13 show exemplary encapsulation modules and also production stages of exemplary encapsulation modules.
Figure 11B:
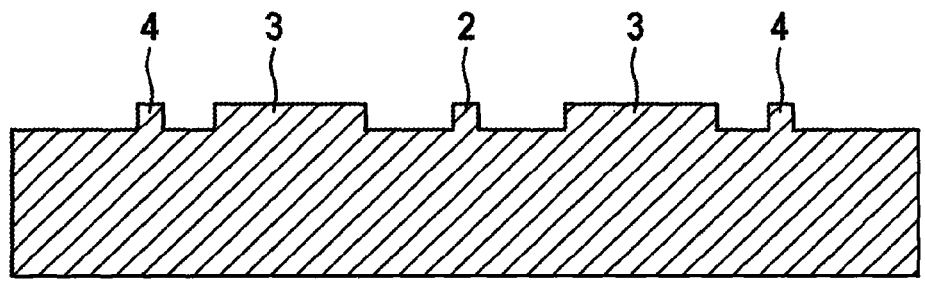
Figure 11C:
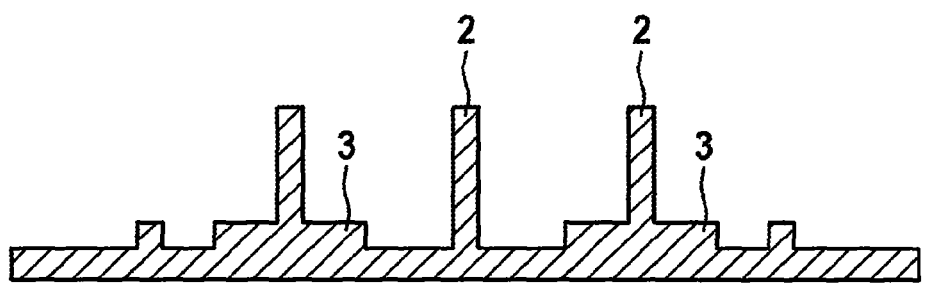
Figure 11D:
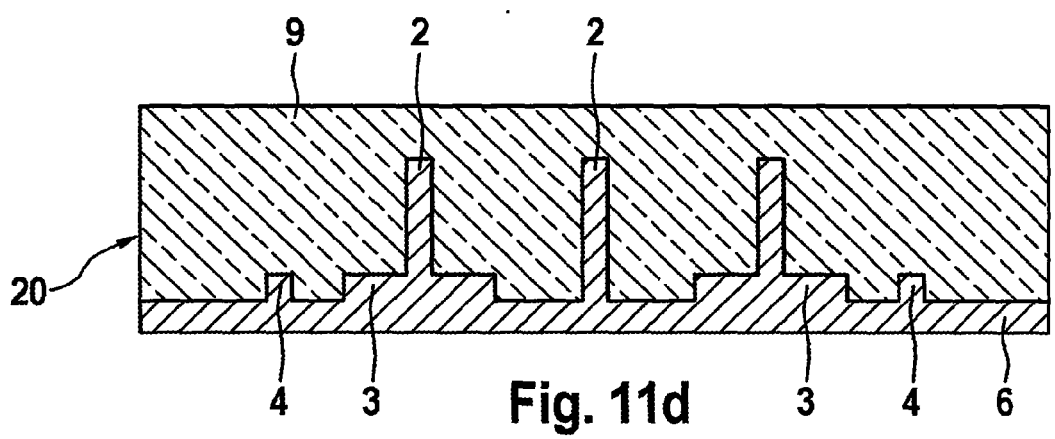

FIG. 10 shows, by contrast, an exemplary structure module B with structures 15 in both sides of the membrane. In this case, the sizes of the cavities 12 can be formed as desired by means of an anisotropic etching process by way of example. In this case, structure module B comprises by way of example two structure wafers joined together by means of frames and anchor points.

FIG. 11, FIG. 12 and FIG. 13 illustrate an exemplary method for producing an encapsulation module, including different variants, on the basis of various illustrated steps. In this case, FIG. 11*a*) shows the base material or the blank 1 in the form of a highly doped and thus conductive silicon wafer. FIGS. 11*b*) and *c*) illustrate exemplary steps of the anisotropic etching processes for producing the subsequent semiconductor electrodes 3, the plated-through hole 2 and semiconductor interconnects 4. In this case, during the etching process, the respective semiconductor electrode geometry is maintained from FIG. 11*b*) to FIG. 11*c*). In FIG. 11*d*), the exemplary electronic connection means such as the plated-through holes 2, the semiconductor interconnects 4 and the semiconductor electrodes 3 are embedded with an electrically insulating embedding material 9, for example potted glass having a silicon-like thermal expansion behavior. Said material is subsequently hardened, wherein the connections of the material to the electronic connection means and the residual block or pedestal 6 composed of silicon become mechanically stable. In this case, embedding material 9 is formed as a substantially disk-shaped body 20.

Figure 12A:
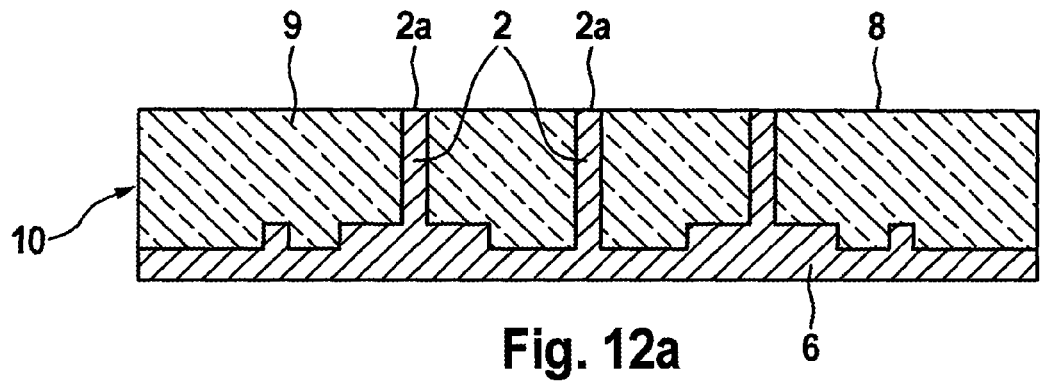
Figure 12B:
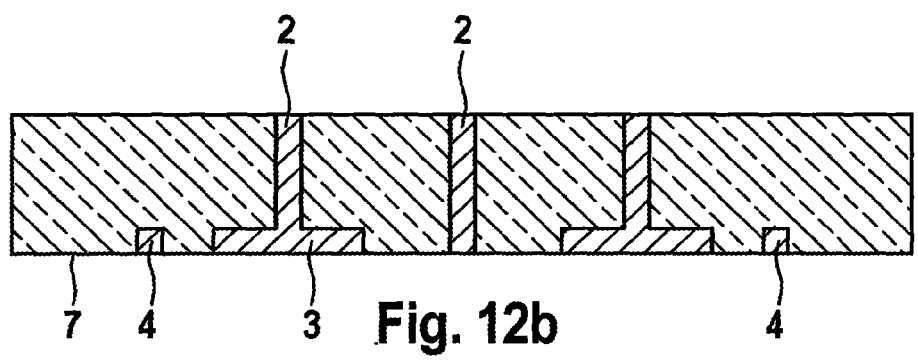

In FIG. 12*a*), the embedding material 9 is ground away at the upper surface, and this surface is polished, for example to such an extent that the plated-through holes 2 each have a corresponding uncovered surface 2*a* terminating flush with the upper surface or top surface 8 of the disk-shaped body 10. FIG. 12*b*) shows a correspondingly ground-back pedestal 6 of the silicon wafer, such that the plated-through hole 2, the semiconductor interconnects 4 and the semiconductor electrodes 3 each have an uncovered, flush surface at this lower surface, the bottom surface 7, as well. In this case, these electronic connection means are embedded in the potting material in an electrically insulated fashion with regard to their lateral contact areas. Additional cavities 12 are introduced into the semiconductor electrodes 3 into the encapsulation module illustrated by way of example in FIG. 12*c*). This can be achieved by means of an etching process, for example. Said cavities 12 serve by way of example in each case for the freedom of deflection of a structure which can be encapsulated by means of the exemplary encapsulation module A. FIG. 12d) shows an exemplary embodiment of an encapsulation module A having by way of example additionally applied stoppers or buffer elements 11 produced by the application and structuring of silicon oxide. Said buffer elements 11 are applied to semiconductor electrodes 3, by way of example. In addition, encapsulation module A in this embodiment, too, has additional semiconductor interconnects 4 composed of highly doped silicon. These can be connected to electrodes and plated-through holes, by way of example.

Figure 12C:
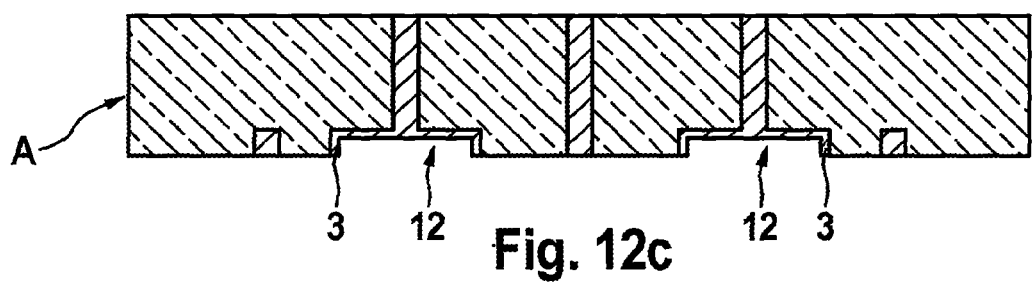
Figure 12D:
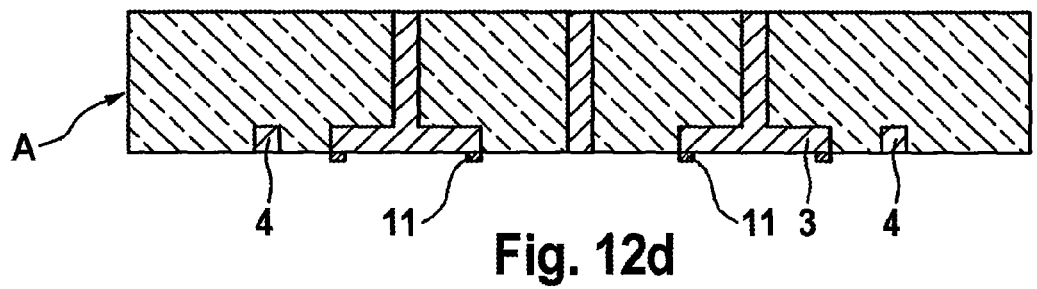

In one exemplary embodiment (not illustrated) of the encapsulation module from FIG. 12c), some semiconductor electrodes are completely removed in order to provide larger cavities. In this case, by way of example, semiconductor electrodes are used which are not connected to a plated-through hole, but rather are formed individually or separately. By removing such semiconductor electrodes, it is possible to produce cavities in the embedding material such as glass or polymer in a relatively simple manner.

Figure 13A:
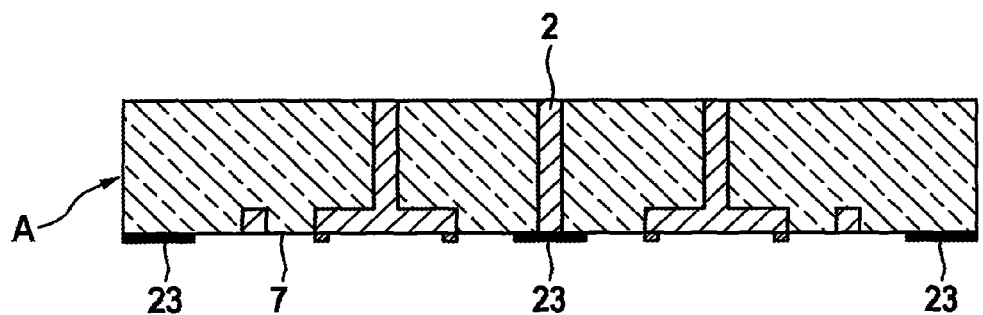
Figure 13B:
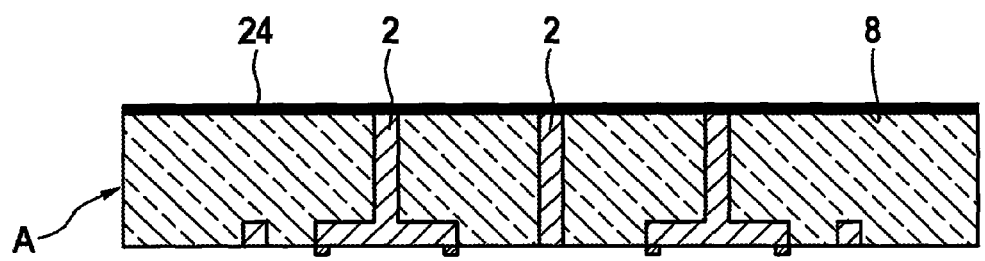
Figure 17A:
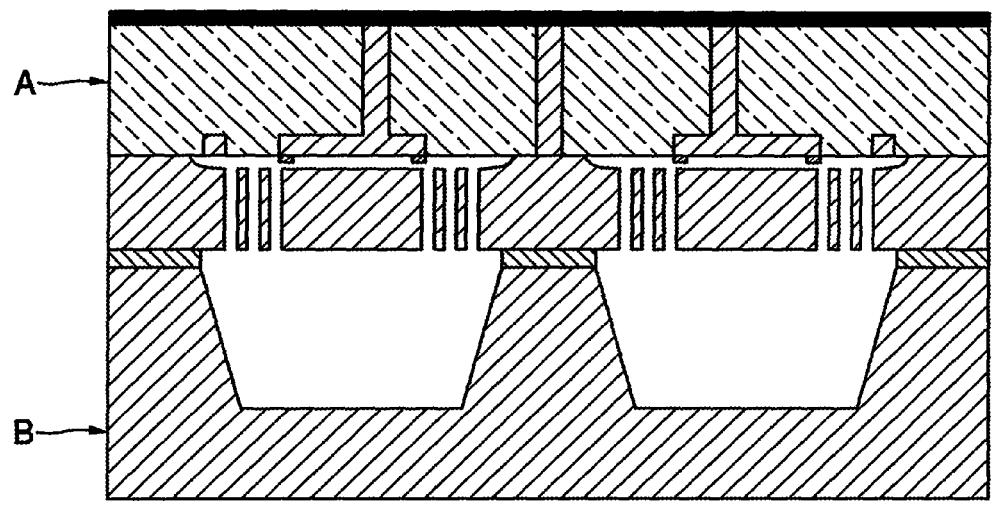
FIGS. 17 to 20 show exemplary embodiments of micromechanical arrangements comprising an encapsulation module which encapsulates one or two structure modules, in particular hermetically.
Figure 17B:
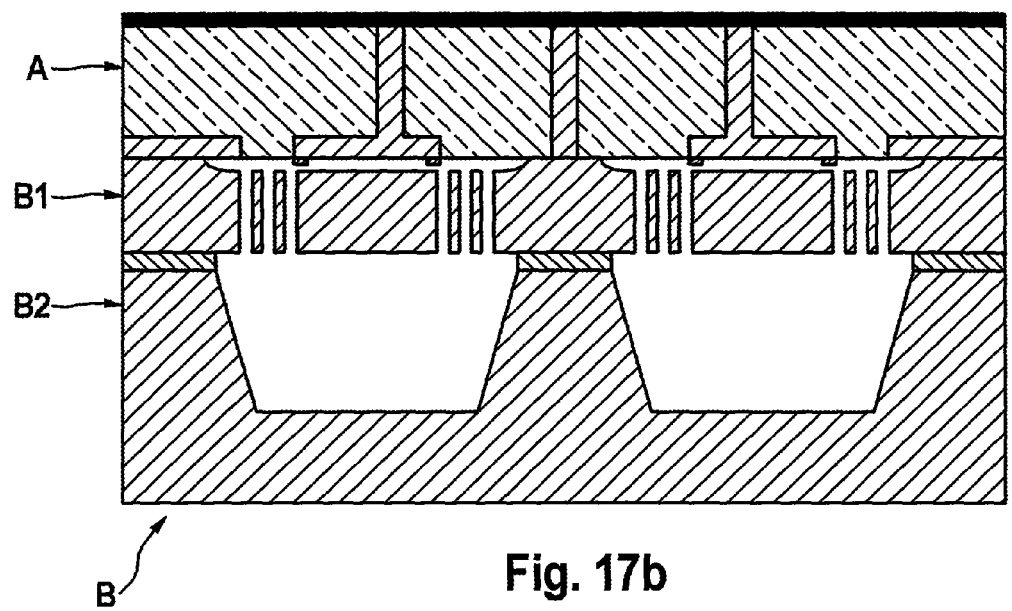
Figure 18A:
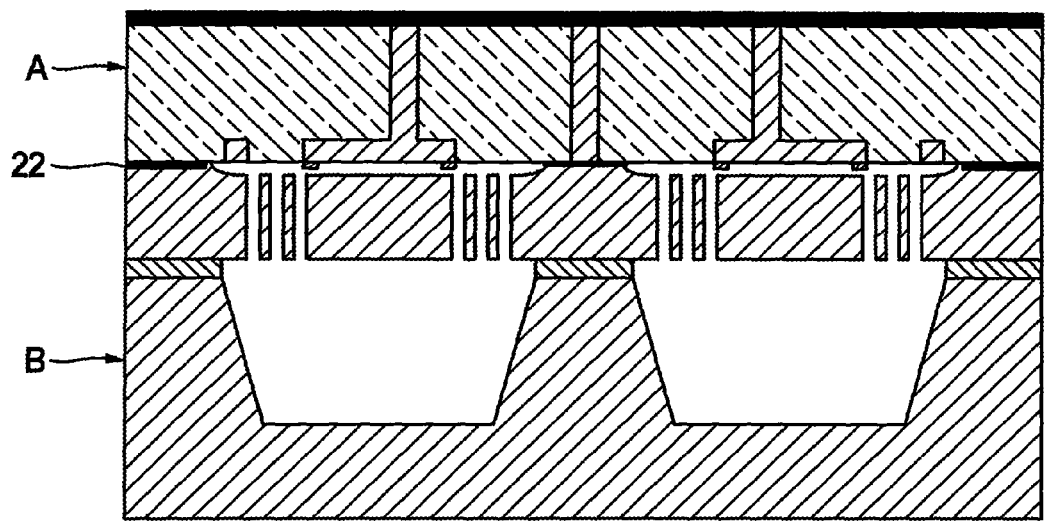
Figure 18B:
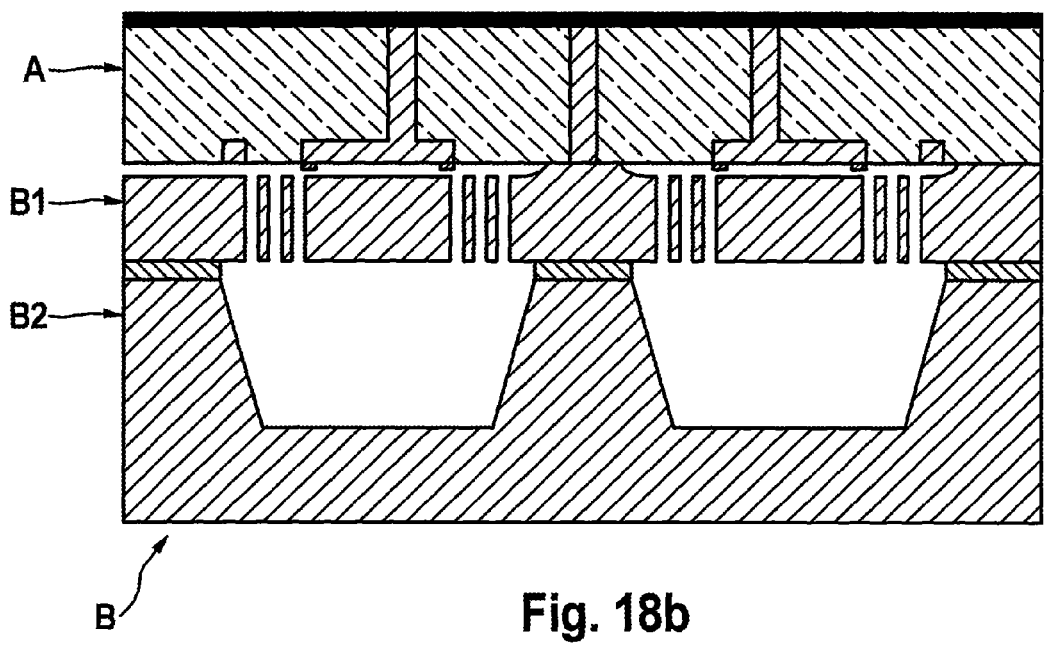

The arrangement of exemplary metal layers 23 shown in FIG. 13a) as eutectic bonding frames at the edge of the bottom surface 7 of an exemplary embodiment of an encapsulation module A is advantageous for specific applications. Moreover, the plated-through hole 2 can be contact-connected by means of a metal layer 23 by way of example. In FIG. 13b), the exemplary encapsulation module A has a conductive layer 24, in particular composed of metal, at the upper outer surface or top surface 8 of said module. The plated-through holes 2 are thereby electrically conductively connected.

FIGS. 14, 15 and 16 illustrate a further exemplary method for producing an encapsulation module on the basis of steps or fabrication stages illustrated by way of example. In this case, some of the fabrication stages should likewise be understood as alternative exemplary embodiments of an encapsulation module.

FIG. 14 and FIG. 15 show production stages for an encapsulation module with an electrode configuration or with semiconductor electrodes. In this case, encapsulation module A in FIG. 15c) shows two semiconductor electrodes 3 each having a cavity 12 and two semiconductor electrodes 3 without a cavity. Semiconductor electrodes 3 are in each case connected to a plated-through hole 2. Moreover, encapsulation module A has semiconductor interconnects 4. Said semiconductor interconnects 4 are likewise suitable for electrical contact-connection from the bottom surface 7. FIG. 15d) illustrates an alternatively exemplary encapsulation module A having, with respect to the bottom surface 7, metal layers 23 respectively applied on plated-through holes 2 and stoppers or buffer elements 11 composed of electrically nonconductive material applied on two semiconductor electrodes 3 and also the metal layers or electrodes 23. Furthermore, encapsulation module A has semiconductor interconnects 4.

In FIG. 16a), a passivation layer 25 is applied to exemplary encapsulation module A on both sides. Said layer is open at a desired location. The passivation layer prevents the removal or damage of electronic connection means such as semiconductor electrodes 3 or plated-through holes 2 in the course of a subsequent etching process for producing a tunnel through the base surfaces of the encapsulation module. FIG. 16b) shows a passage opening through the encapsulation module from FIG. 16a), which opening was produced by the removal of a plated-through hole. This removal is carried out by means of an etching process, by way of example. The passage opening or the open tunnel 13 enables a media exchange and/or a defined setting of a medium, such as a gas or a liquid, for example, through the encapsulation module. The passivation layer is subsequently removed again. In FIG. 16c), after the removal of the passivation layer has taken place, by way of example a contact metallization 24 is applied on the top surface 7 or the opposite base surface with respect to the semiconductor electrodes 3.

In an alternative exemplary embodiment (not illustrated), open tunnel 13 is closed off again by means of a glass material, after the introduction of a defined atmosphere into a structure space through the open tunnel 13.

Figure 19:
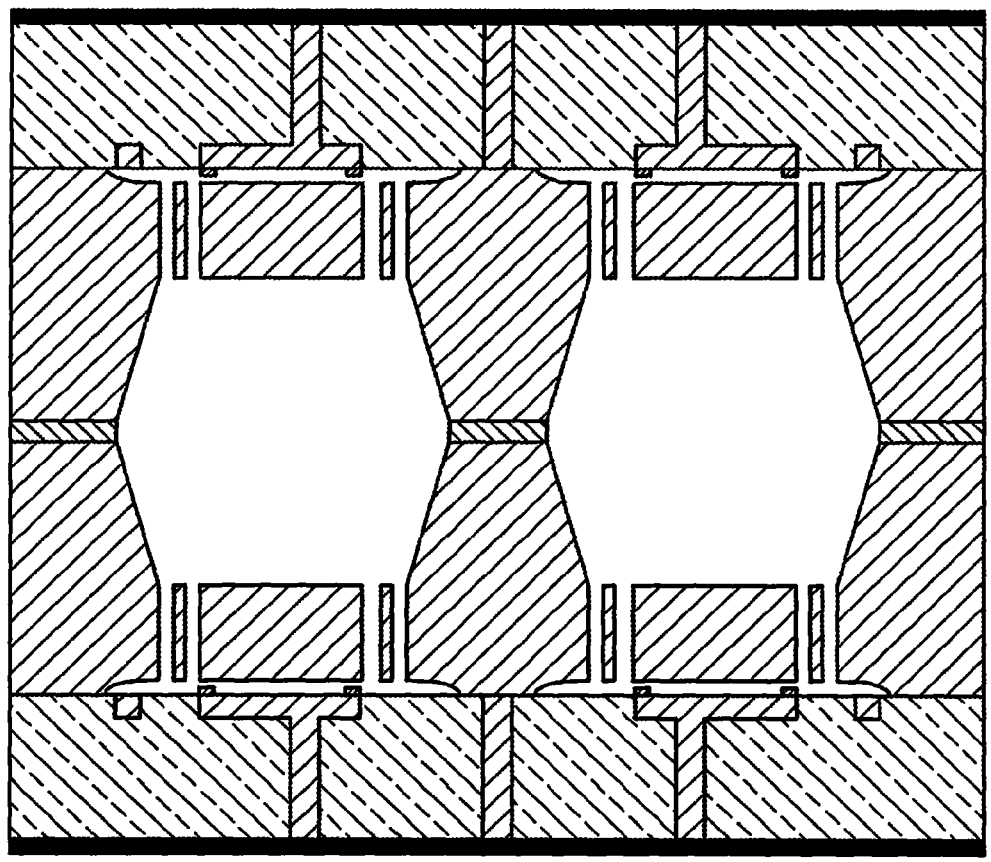
Figure 20:
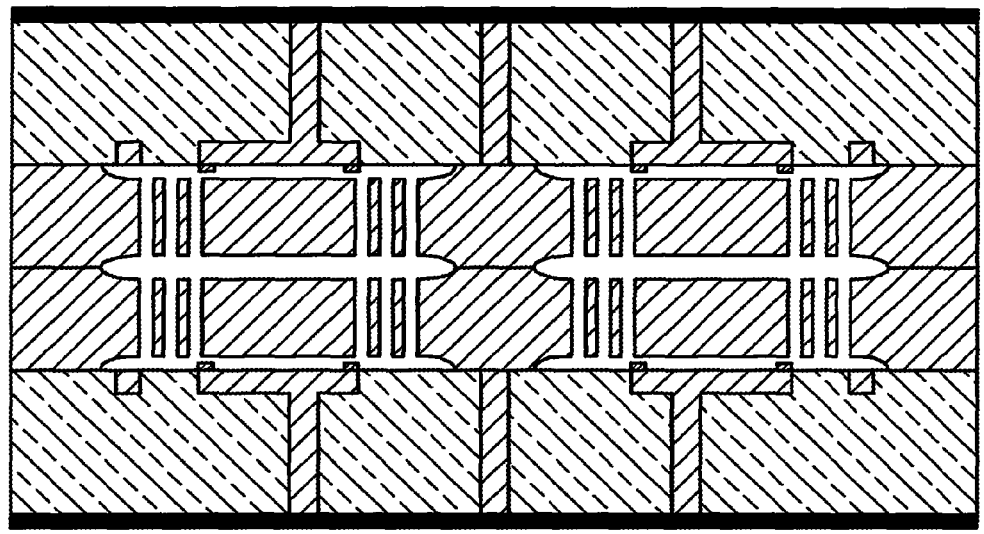

FIGS. 17, 18, 19 and 20 illustrate exemplary embodiments of micromechanical arrangements comprising an encapsulation module A which encapsulates one or two structure modules B, in particular hermetically or in a gastight manner. Here in FIGS. 17 and 18 an encapsulation module A is in each case arranged on structure module B. Here said structure module B in each case comprises a structure wafer B1 and a carrier wafer B2, which are connected to one another by means of a joining method. The corresponding joining surface 22 between encapsulation module A and structure module B extends over the frame on the right and on the left, and the anchor surface of the respective structure wafer. In the region of the respective structures, a certain gap spacing with respect to the encapsulation module is present opposite the two cavities of the structure module, said gap spacing enabling deflections of the structure. FIG. 17a) illustrates the case where anodically bondable glass is used as potting material, whereby the particularly robust anodic bonding method can be used for the hermetic or gastight encapsulation of the structure module with the encapsulation module. As illustrated in FIG. 17b), in this case and in the case where a vacuum is intended to be set in the interior, the glass surfaces in the interior of the structure module should be coated with gettering material, since glass is known for its outgassing. In the exemplary embodiment from FIG. 18a), for example Au—Si or Al—Ge or other eutectic metal compounds is or are used as joining agent 22 between encapsulation module A and structure module B, whereby an electrically conductive connection is automatically produced and is used for example in the case of eutectic bonding. FIG. 18b) illustrates for example an embodiment in which the gap between the modules extends over the bonding frame and a lateral opening is thus present, through which a media exchange between exterior and structure space can be effected. FIGS. 19 and 20 in each case illustrate by way of example an encapsulation on the top side and underside of a structure module pair and thus an encapsulation on both sides by means of an encapsulation module. It is thereby possible to realize sensors having a different measurement orientation, in particular seismic masses of a sensor element which can be deflected in different orientations, without the surface area required for this purpose becoming larger. In this case, the structure modules are connected to one another by means of bonding, for example.

Figure 21:
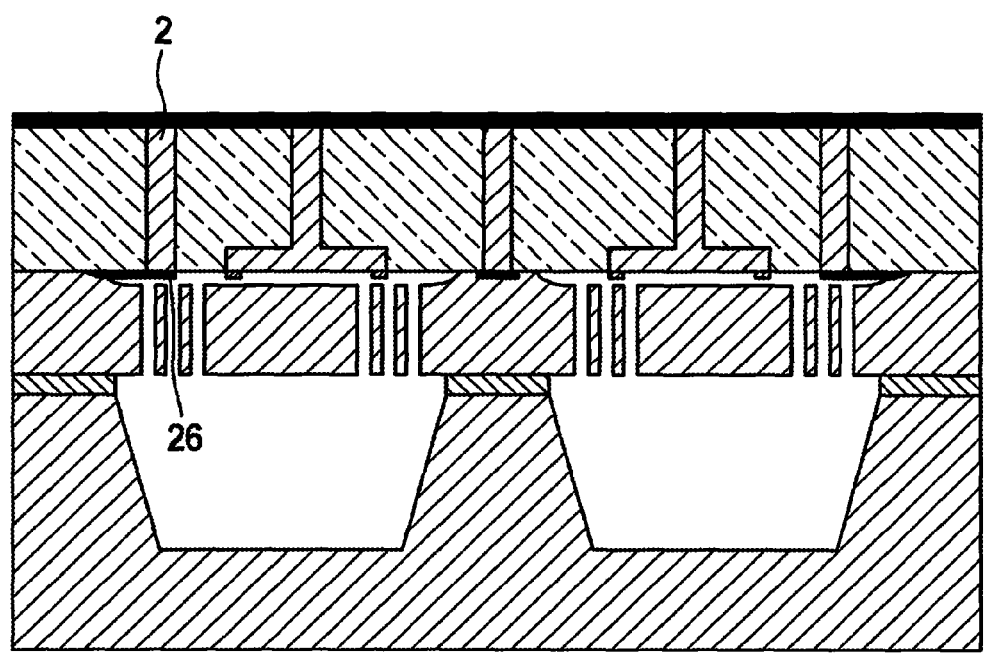
FIGS. 21, 22 show exemplary electrical contact-connections of a structure module encapsulated with an encapsulation module.

FIG. 21 depicts for example how it is possible to implement an electrically conductive contact-connection by way of example comprising a plated-through hole 2 from encapsulation module to structure module by means of an additional metallic pressure contact or crimp contact 26. In the case of anchor contacts, the crimp contact is surrounded by the joining surface, for example.

Figure 22:
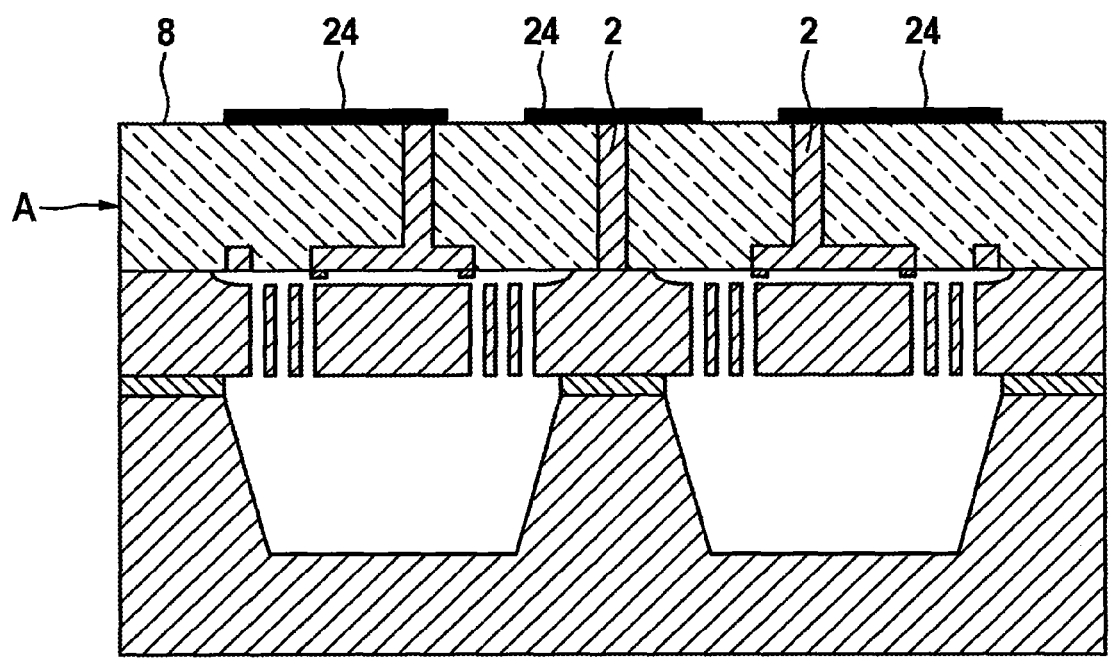

FIG. 22 shows for example a structured contact metallization 24 on the upper outer surface or top surface 8 of the encapsulation module A. Such a structuring takes place in the context of a production method by way of example after the preceding steps. Contact metallizations 24 serve for externally making electrical contact with the plated-through holes 2.

Figure 24:
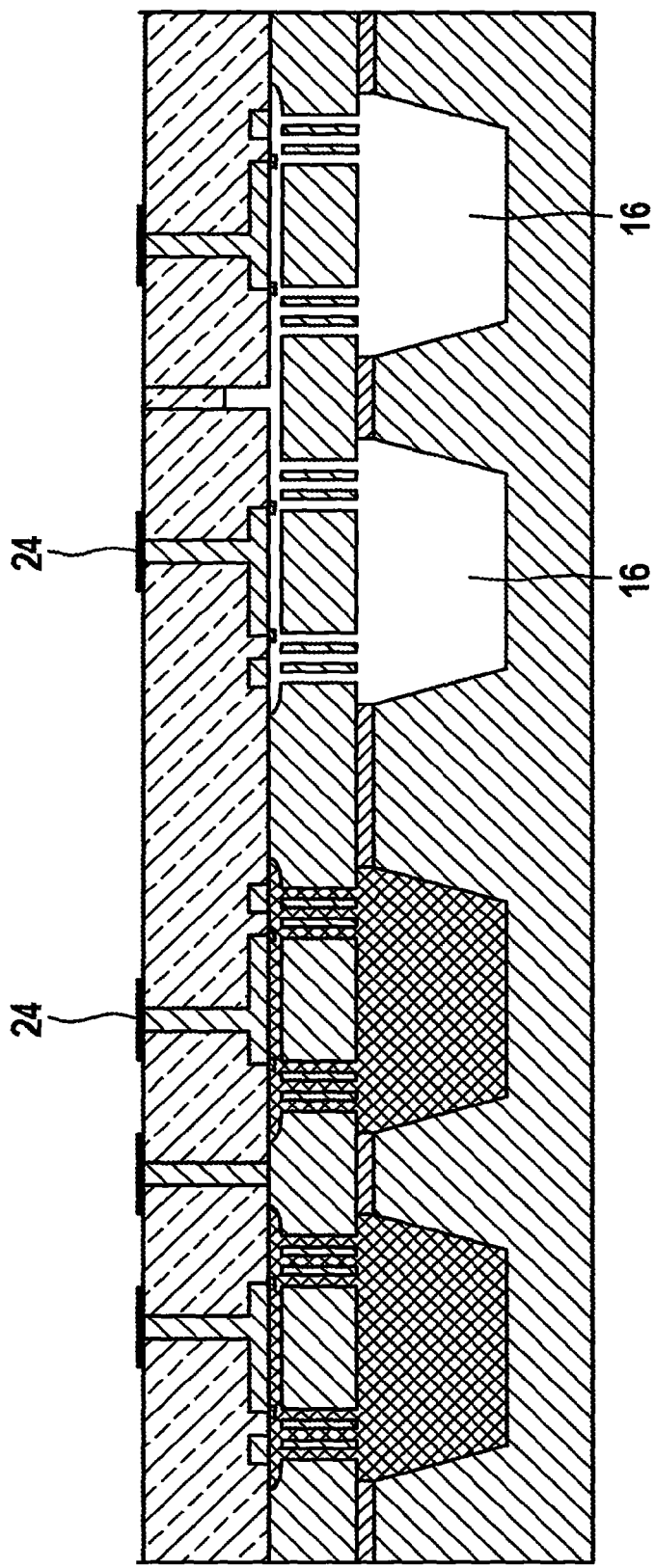

FIGS. 23 and 24 illustrate the selective inclusion of different media within different structure spaces 16 of a structure module encapsulated with an encapsulation module by way of example. These structure spaces 16 comprise the cavities below and above the structures of the structure wafer. In this connection, FIG. 23a) shows an exemplary embodiment in which the gap spacing extends between structure module and encapsulation module, in alignment with a tunnel 13 to the upper outer surface of the encapsulation module, above the anchor point 19. Through this open tunnel 13, by way of example the included medium can escape from the structure interior 16 or some other defined medium can alternatively be introduced into said structure interior. By way of example, the encapsulation by the encapsulation module can take place under a vacuum, whereby the structure interiors of the left-hand structures, identified by crosshatching, have a vacuum in order to achieve for example very high qualities in the case of rate-of-rotation sensor elements. Structure interiors 16, arranged on the other side, which are accessible via open tunnel 13, fill with ambient atmosphere after the ventilation of the bonding chamber. Alternatively by way of example inlets and outlets for pressure sensors, liquid channels, pumps or valves can be produced in this form. In FIG. 23b), for example as required, in particular after the state illustrated for example in FIG. 26a), the open structure interior 16 is evacuated again and filled with the desired medium required for the respective application. By way of example, in this connection the corresponding desired pressure is also set. By way of example, it is possible to set an Ag gas excess pressure in order to supercritically damp an acceleration sensor. After media exchange has taken place, or after the setting of the medium, including the desired pressure, the opening is sealed in a vacuum tight manner. For this purpose, by way of example, a potting material such as liquid glass is introduced into the opening and subsequently hardened. As illustrated for example in FIG. 24, the contact metallization 24 is subsequently structured.

Figure 25:
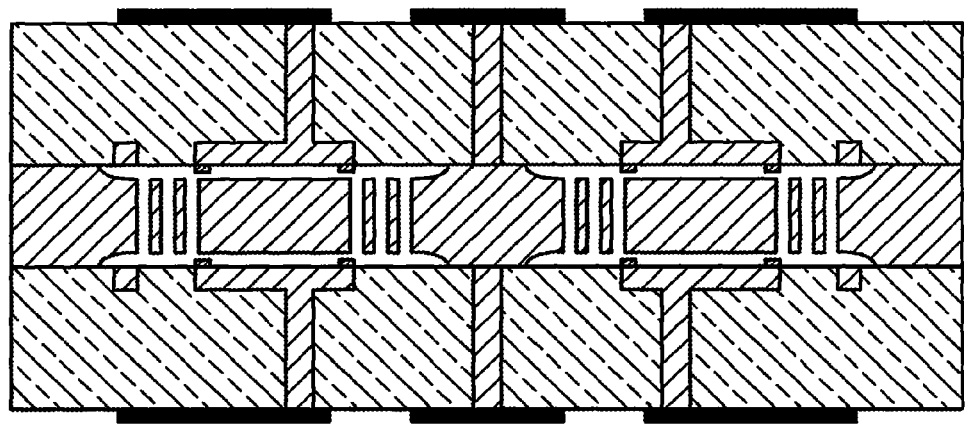
FIGS. 25, 26 show two exemplary micromechanical arrangements.
Figure 26:
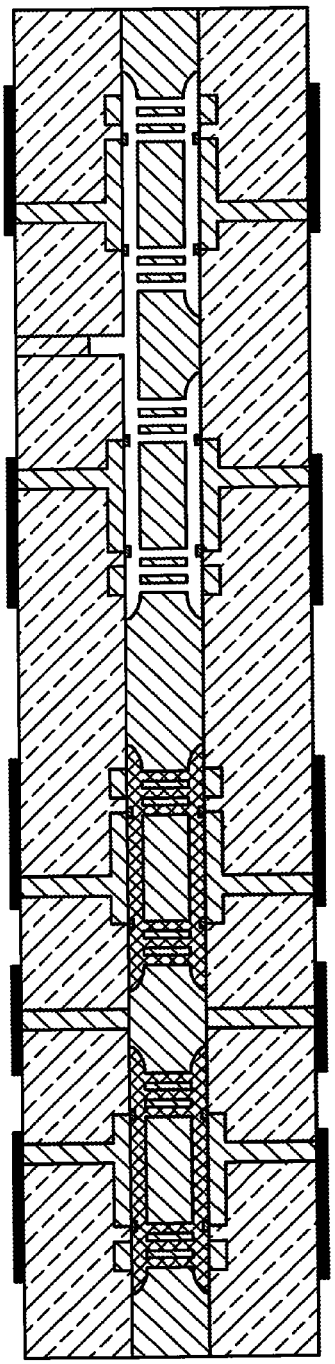

FIGS. 25 and 26 illustrate by way of example the hermetic, double-sided encapsulation of a structure module with two encapsulation modules. In this case, FIG. 25 shows by way of example structure interiors 16 filled with an identical medium within the entire system and, by contrast, FIG. 26 shows a micromechanical arrangement whose structure spaces are selectively filled.

Figure 27:
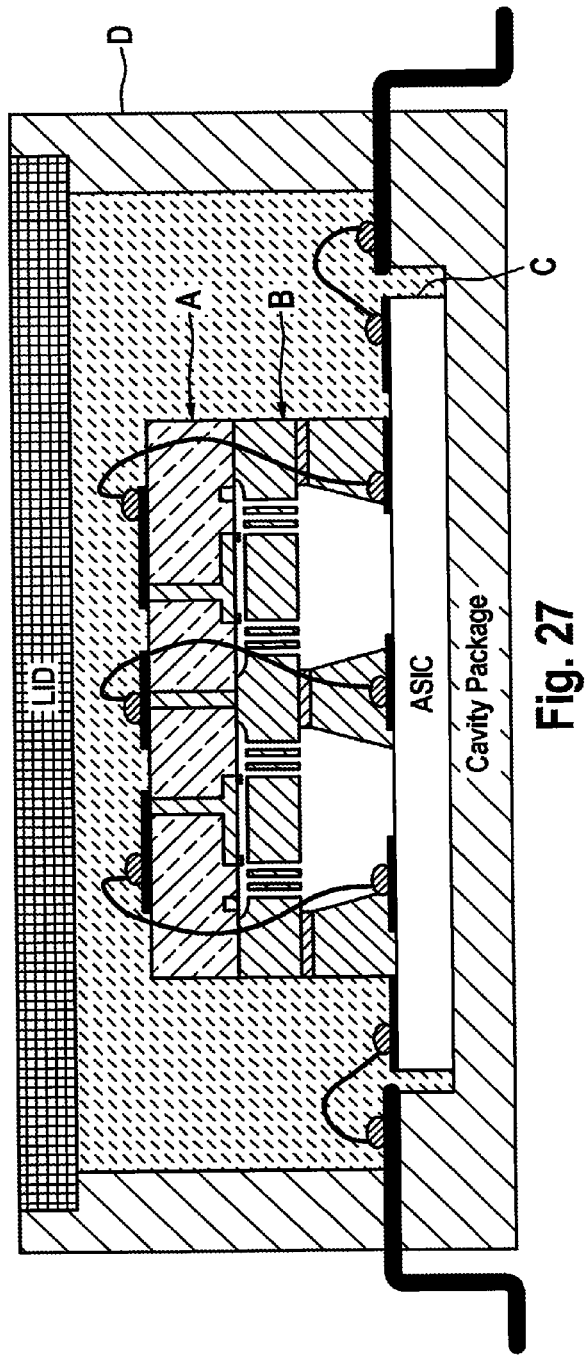
FIGS. 27 to 29 show exemplary embodiments of micromechanical arrangements in an additional housing.
Figure 28:
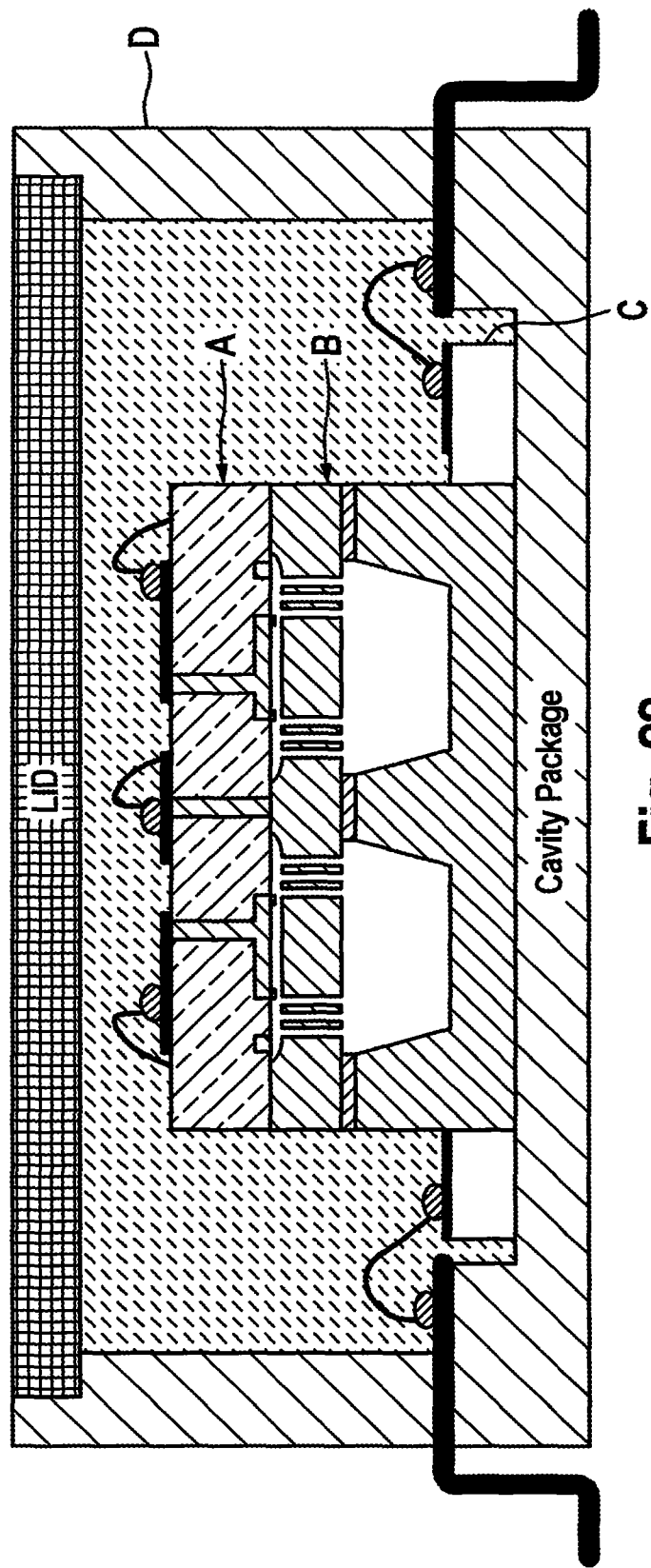
Figure 29:
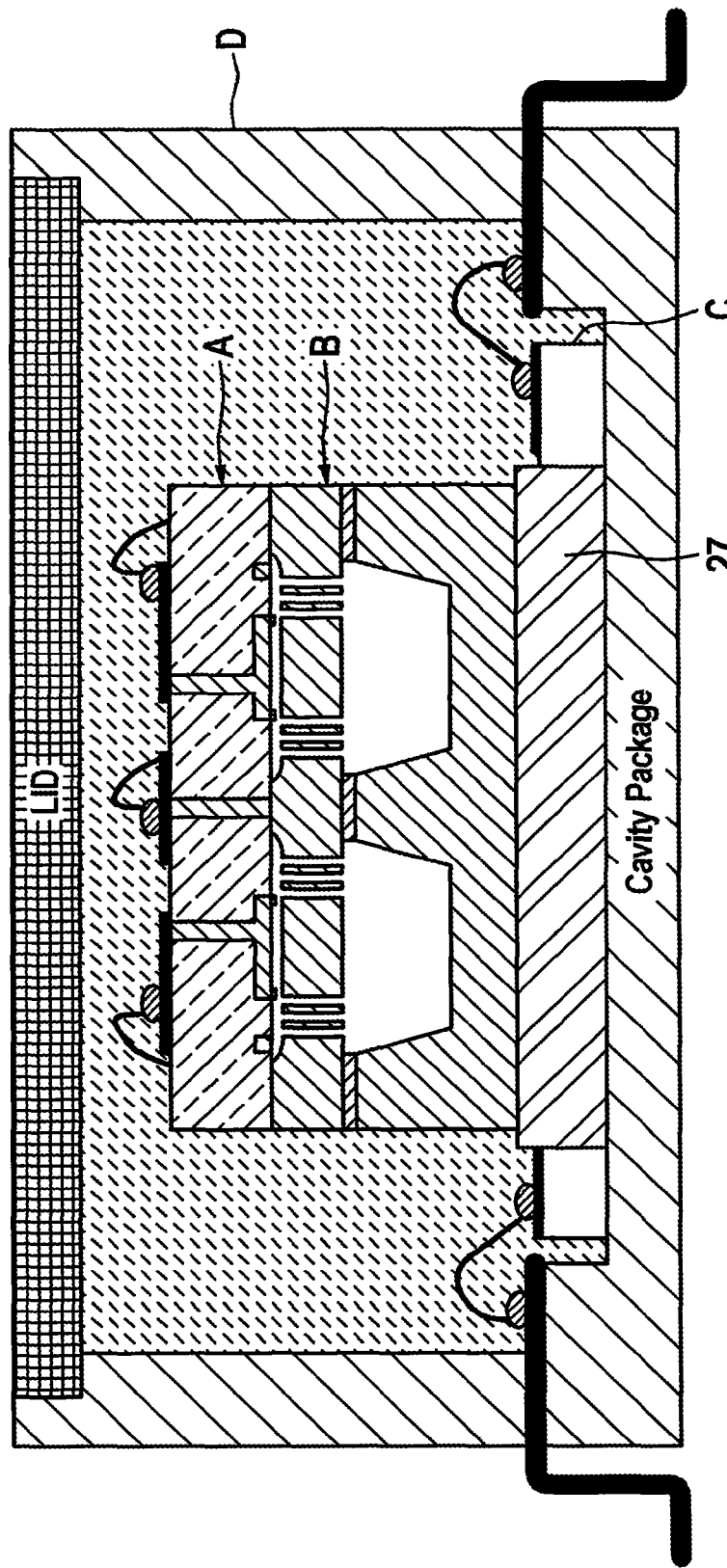

FIGS. 27, 28 and 29 show exemplary micromechanical arrangements of encapsulated structures including control and signal evaluation circuit (ASIC) C in a preformed housing D, wherein the encapsulated structures, comprising a structure module B encapsulated by means of an encapsulation module A and the ASIC C are connected to the respective electrical connections by means of wire bonding. The arrangement of encapsulated structures and, in particular, an ASIC alongside one another in a preformed housing with electrical connections which make the signals from the ASIC and the encapsulated structure accessible externally and make contact with the latter by means of wire bonding is possible in a particularly advantageous manner using the plated-through hole and semiconductor interconnect technology of the encapsulation module A. In this case, FIG. 27 shows a view in which the ASIC C is arranged in front of the encapsulated structure A, B and FIG. 28 shows a view in which the ASIC C is arranged behind the encapsulated structure A, B. FIG. 29 shows an exemplary micromechanical arrangement in which an interlayer 27 is arranged between housing base and the encapsulated structure A, B, which interlayer mechanically and thermally decouples the encapsulated structure from the housing.

Figure 30:
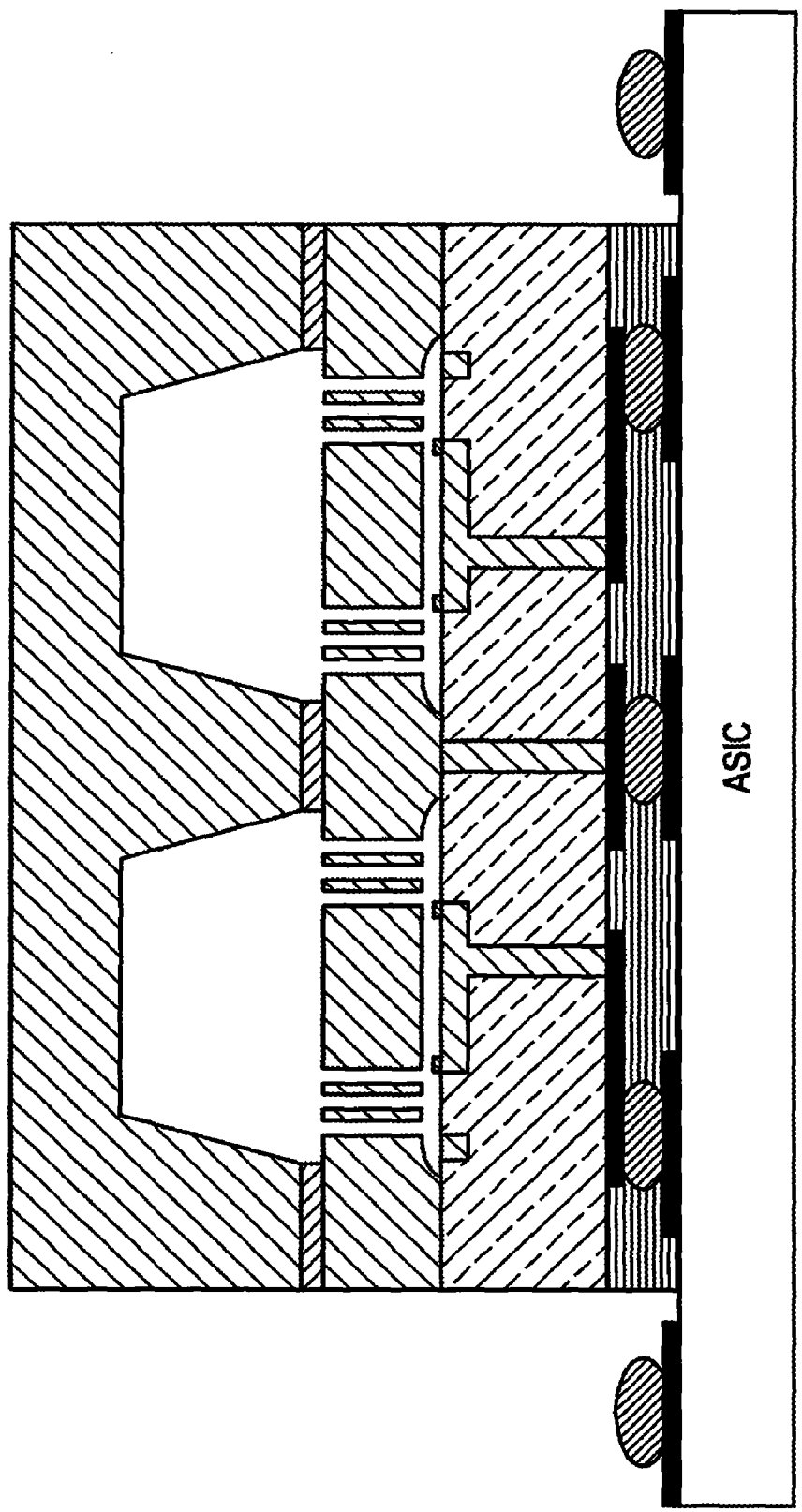
Figure 31:
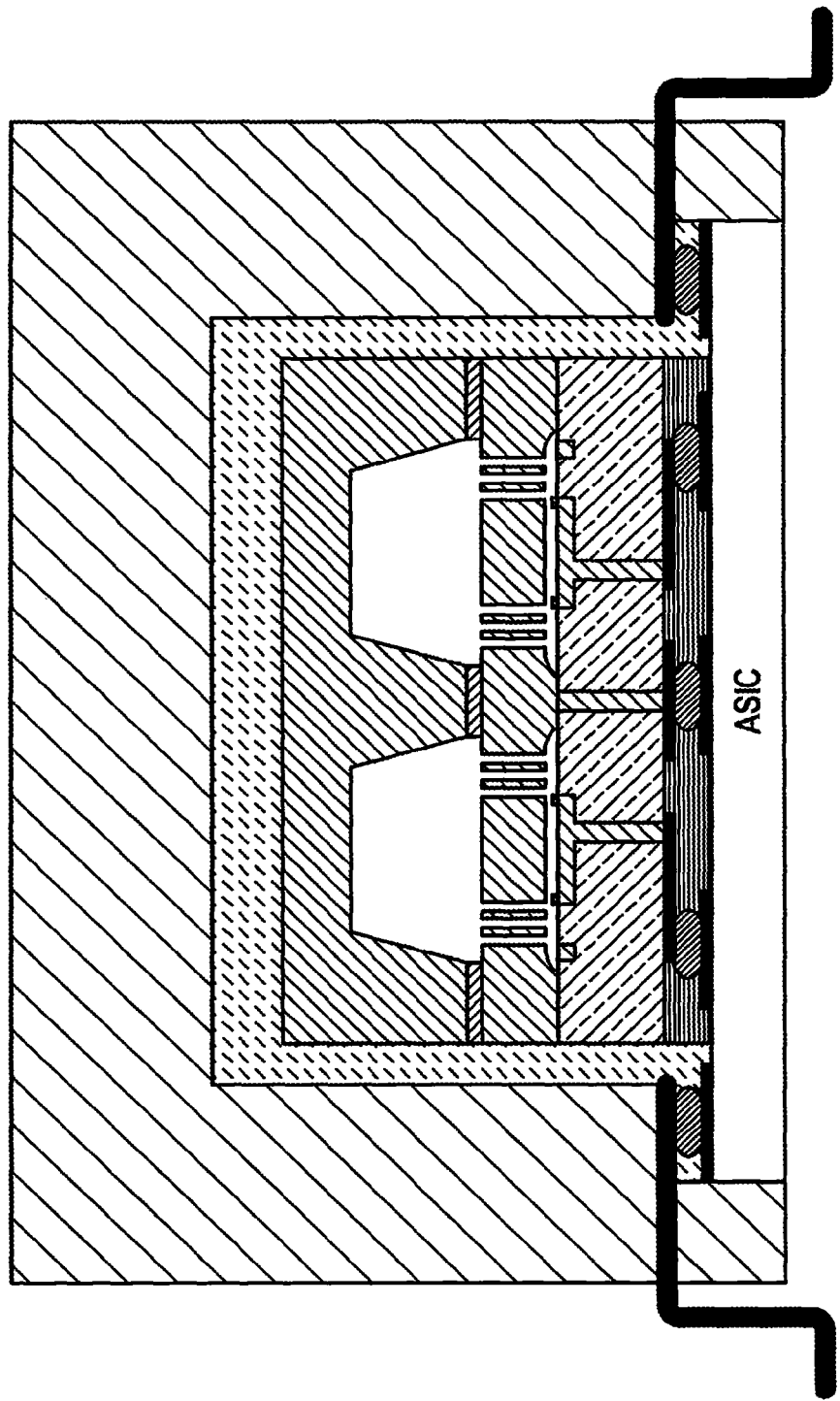

FIGS. 30 and 31 each illustrate by way of example an arrangement of encapsulated structures including control and signal evaluation circuit (ASIC) in which the encapsulated structure is arranged directly on the ASIC by means of flip-chip and both of them are positioned in a preformed housing. This assembling on the ASIC by means of flip-chip technology is possible through the use of an encapsulation module with plated-through holes and, in particular, semiconductor interconnects. By way of example, there is situated between ASIC and encapsulated structure an embedding material (underfill) for mechanical fixing, for vibration damping and for protection of the electrical contacts, for example against particles, the potting material or moisture. FIG. 31 illustrates a corresponding exemplary arrangement in a cavity housing filled with a gel, for example. The contact-connection between the encapsulated structure and the ASIC, and between the ASIC and contacts led toward the outside, is realized for sample by means of soldering beads or ball grids.

Figure 32:
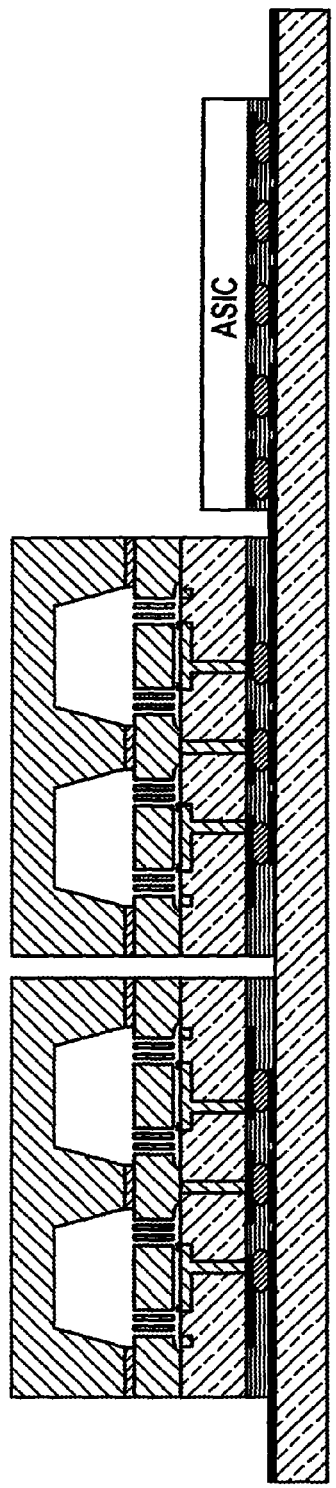
Figure 33:
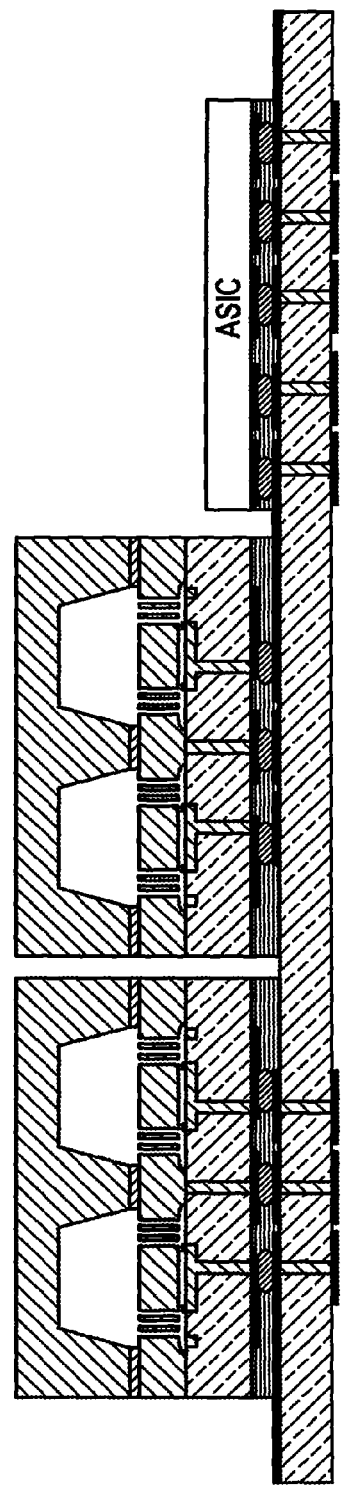

FIGS. 32 and 33 show exemplary micromechanical arrangements having a plurality of encapsulated structures and at least one ASIC. In this case, these components are arranged on a simple silicon wafer in FIG. 32 and on an encapsulation module or a corresponding encapsulation wafer having plated-through holes in FIG. 33. In FIG. 33, the components are electrically conductively connected directly to the encapsulation module on which they are arranged via plated-through holes.

Figure 34:
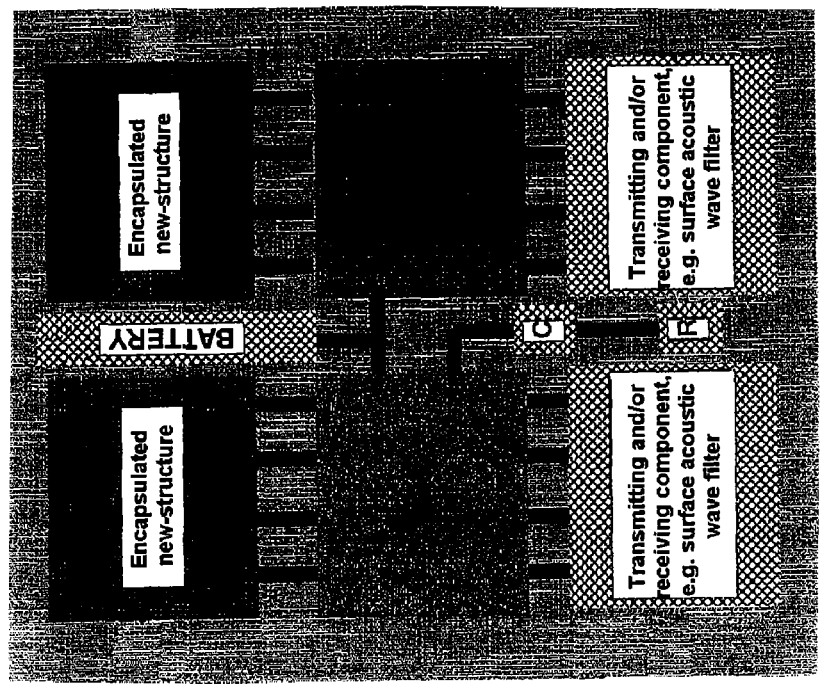

FIG. 34 illustrates an exemplary embodiment of a system or of a component arrangement on an encapsulation module, with plated-through holes and semiconductor interconnect levels and by way of example wireless transmitting and receiving components (SAW), including a battery for supplying power.

FIG. 35 shows an exemplary embodiment of a packaging arrangement of a chip stack in a simple cavity housing. The electrical contacts of the chip stack are connected to the carrier by means of flip-chip technology. This carrier or carrier wafer terminates the housing as a base.

FIG. 36 shows an exemplary embodiment in which an encapsulation module having plated-through holes is used as a carrier module for the components and housing base. Thus, the chip stacks can be arranged in the housing by means of soldering beads or ball grid arrays directly onto the encapsulation module used as a housing base and can be electrically connected to said module and this arrangement can be mounted on an electronic printed circuit board (not illustrated) and be connected to the latter by means of soldering beads or ball grid arrays fitted to the plated-through holes. In this case, the self-aligning effect during the soldering of the ball grid array to the soldering pads of the carrier material situated underneath has a positive effect on the accuracy of the overall system. By way of example, a preformed plastic or metal housing or an MID package can be used as the housing. The linking of the housing to the encapsulation module having plated-through holes is effected for example by adhesive bonding or alternatively by way of example by laser welding. The free interior is filled by gel, for example.

Such arrangements of encapsulated structures can also be directly insert-molded with plastic by a leadframe.

Figure 37:
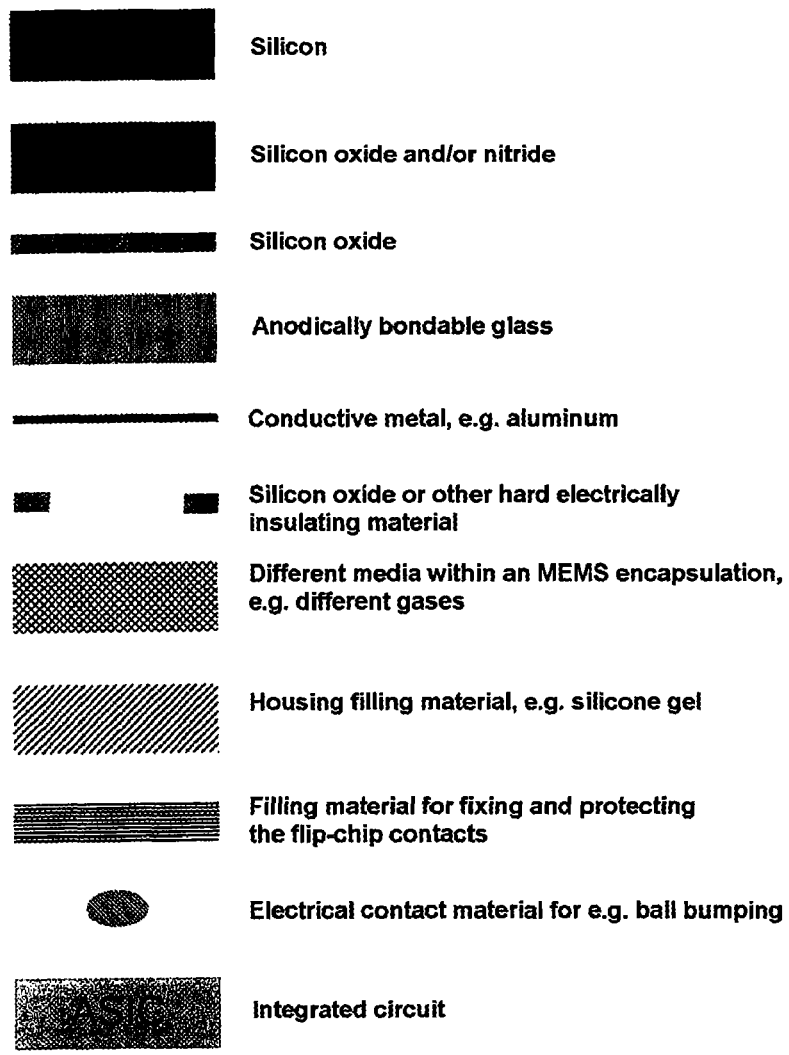
FIG. 37 shows patterns which occur in FIGS. 7-36 and are allocated exemplary meanings.

In FIG. 37, in particular specific patterns which occur in the above figures are allocated exemplary meanings, whereby FIG. 37 forms an exemplary legend for figures described above.

Examples illustrated in the figures and also the additionally proposed embodiments relate in particular to all developments of the production method and also the encapsulation module and/or the micromechanical arrangement produced by this respective method.

The invention claimed is:

1. A method for producing an encapsulation module and/or for encapsulating a micromechanical arrangement, comprising the steps of:
   forming electronic connection means from a blank of electrically conductive semiconductor material, by means of one or more structuring processes and/or etching processes, wherein, in the course of forming the electronic connection means, a pedestal of the semiconductor material arises, on which the electronic connection means are arranged,
   embedding the electronic connection means within an embedding material;
   removing the embedding material and/or the semiconductor pedestal after the embedding step to an extent such that a defined number of the electronic connection means have electrical contacts on at least one outer surface of the encapsulation module thus produced,
   wherein in the course of forming the electronic connection means, by means of the at least one structuring and/or etching process, on the pedestal of the semiconductor material, at least one insular material hump is formed, on which a plated-through hole is arranged in, and which embodies a semiconductor electrode.

2. The method as claimed in claim 1, wherein during the embedding step of the electronic connection means with the embedding material and/or during subsequent hardening of the embedding material, the embedding material is formed into a substantially disk-shaped body in which the electronic connection means are embedded, wherein the embedding process comprises at least one casting and/or melting process.

3. The method as claimed in claim 1, wherein at least one of the outer surfaces of the encapsulation module is coated with at least one conductive material.

4. The method as claimed in claim 1, wherein electronic and/or mechanical means including electrical contact elements, buffer elements or cavities are applied on at least one outer surface of the encapsulation module, for connecting the encapsulation module to at least one micromechanical structure and/or at least one further micromechanical module.

5. The method as claimed in claim 1, wherein glass is used as the embedding material, and in that the glass is potted in liquescent fashion over the electronic connection means or is potted directly as liquid glass and is subsequently hardened.

6. The method as claimed in claim 1, wherein at least one tunnel is produced between at least two opposite outer surfaces of the encapsulation module by at least one structuring process and/or etching process.

7. The method as claimed in claim 6, wherein the at least one tunnel is produced by removing at least one plated-through hole.

8. The method as claimed in claim 1, wherein at least one additional micromechanical structure is hermetically encapsulated by the encapsulation module, wherein prior to the encapsulation step, at least one electrical plated-through hole of the encapsulation module is removed by an etching process, whereby at least one tunnel through the encapsulation module into the interior of the corresponding micromechanical structure arises, and afterward, through the at least one tunnel, a defined medium with a substantially defined pressure is introduced into the respective interior of the corresponding micromechanical structure.

9. The method as claimed in claim 8, wherein the at least one tunnel is subsequently closed off.

10. The method as claimed in claim 9, wherein the subsequent closing off of the at least one tunnel is carried out by introducing an embedding and/or potting material into said at least one tunnel and subsequently hardening the potting material introduced into the tunnel.

11. An encapsulation module for encapsulating micromechanical structures, and/or a micromechanical arrangement, produced in accordance with a method as claimed in claim 1, which comprises a substantially disk-shaped body composed of electrically insulating embedding material and at least one electrical plated-through hole composed of electrically conductive semiconductor material which is embedded in the disk-shaped body and is formed and arranged such that it electrically conductively connects two electrical contacts on two, opposite, outer base surfaces comprising the bottom surface and the top surface of the disk-shaped body, wherein the encapsulation module and/or the micromechanical arrangement has at least one electrode composed of electrically conductive semiconductor material.

12. The encapsulation module and/or the micromechanical arrangement as claimed in claim 11, wherein the at least one electrode composed of electrically conductive semiconductor material has an interface with one of the base surfaces of the disk-shaped body composed of embedding material and is formed in a manner extended substantially in mound-shaped fashion into the disk-shaped body and is connected to a plated-through hole within said body.

13. The encapsulation module and/or the micromechanical arrangement as claimed in claim 12, wherein at least one semiconductor electrode is an electrically conductive surface of a micromechanical read-out device and/or excitation/drive device or as an electrical connection means.

14. The encapsulation module and/or the micromechanical arrangement as claimed in claim 11, wherein the disk-shaped body has at least one tunnel between the two outer base surfaces, wherein said at least one tunnel is opened or closed off with embedding material or another material.

15. The encapsulation module and/or the micromechanical arrangement as claimed in claim 11, wherein glass, a polymeric material or resin is used as the embedding material.

16. The encapsulation module and/or the micromechanical arrangement as claimed in claim 11, wherein the disk-shaped body is coated with a conductive material at at least one location, on at least one of the two outer base surfaces.

17. The encapsulation module and/or the micromechanical arrangement as claimed in claim 11, wherein said module and/or arrangement has at least one interconnect composed of electrically conductive semiconductor material which, with a base surface, has a common interconnect surface and is formed in a manner corresponding to the at least one semiconductor electrode.

18. The encapsulation module and/or the micromechanical arrangement as claimed in claim 11, wherein the disk-shaped body has, on at least one of the two outer base surfaces, at least one micromechanical means including a buffer element or a cavity, for interaction with additional micromechanical structures.

19. The encapsulation module and/or the micromechanical arrangement as claimed in claim 18, wherein the disk-shaped body is connected to at least one additional micromechanical structure in such a way that it hermetically encapsulates the additional micromechanical structure(s), and that electrical connections and/or contacts of the additional micromechanical structure(s) are electrically conductively connected to and/or electrically interact with one or more plated-through holes and/or semiconductor electrodes and/or semiconductor interconnects which are embedded in the disk-shaped body.

20. The encapsulation module and/or the micromechanical arrangement as claimed in claim 19, wherein the at least one micromechanical means, on at least one of the two outer base surfaces of the disk-shaped body is arranged and formed such that said micromechanical means can interact with the micromechanical means of the at least one additional micromechanical structure including membranes or bending beams.

21. The encapsulation module and/or the micromechanical arrangement as claimed in claim 19, wherein the at least one additional micromechanical structure is/are electrically connected to at least one external, integrated, electronic circuit via the at least one electrical plated-through hole and/or a semiconductor electrode and/or a semiconductor interconnect which is/are embedded in the disk-shaped body.

22. The encapsulation module and/or the micromechanical arrangement as claimed in claim 21, wherein the at least one additional micromechanical structure is/are mechanically connected to at least one integrated circuit that is integrated on a chip, via the disk-shaped body.

23. The encapsulation module and/or the micromechanical arrangement as claimed in claim 11, wherein the disk-shaped body is connected mechanically and/or by means of one or more plated-through holes and/or semiconductor electrodes and/or semiconductor interconnect, electrically conductively to at least one additional micromechanical structure and/or at least one additional micromechanical arrangement and/or at least one integrated circuit, arranged on a chip, by additional soldering beads.

24. The encapsulation module and/or the micromechanical arrangement as claimed in claim 23, wherein the at least one additional micromechanical structure and/or the at least one additional micromechanical arrangement and/or the at least one integrated circuit that is integrated on a chip, is connected to one base surface of the disk-shaped body mechanically and/or electrically conductively by at least one plated-through hole and/or semiconductor electrode and/or semiconductor interconnect, and in that the other base surface of the disk-shaped body is connected to a printed circuit board or an additional electronic circuit or an additional encapsulation module, by soldering beads.

25. The encapsulation module and/or the micromechanical arrangement as claimed in claim 11, wherein the disk-shaped body is arranged and fixed as a cover on a sensor housing, wherein at least one electronic circuit arranged in the sensor housing and/or at least one electronic component and/or at least one micromechanical structure is electrically conductively connected to at least one external electronic circuit via the at least one electrical plated-through hole and/or semiconductor electrode and/or semiconductor interconnect embedded in the disk-shaped body.

26. The use of the encapsulation module and/or of the micromechanical arrangement as claimed in claim 11 in a motor vehicle control system.

27. The method as claimed in claim 1, wherein the electronic connection means include plated-through holes, electrical lines, contacts and/or electronic structures.

28. The method as claimed in claim 1, wherein the blank of electrically conductive semiconductor material is composed of doped silicon.

29. The encapsulation module and/or the micromechanical arrangement as claimed in claim 13, wherein the electrically conductive surface is a capacitor plate.

* * * * *